(12) United States Patent
Jhothiraman et al.

(10) Patent No.: US 11,411,013 B2
(45) Date of Patent: Aug. 9, 2022

(54) MICROELECTRONIC DEVICES INCLUDING STAIR STEP STRUCTURES, AND RELATED ELECTRONIC DEVICES AND METHODS

(71) Applicant: Micron Technology, Inc., Boise, ID (US)

(72) Inventors: Jivaan Kishore Jhothiraman, Meridian, ID (US); Kunal Shrotri, Boise, ID (US); Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/737,777

(22) Filed: Jan. 8, 2020

(65) Prior Publication Data

US 2021/0210499 A1    Jul. 8, 2021

(51) Int. Cl.
| | |
|---|---|
| *H01L 27/11548* | (2017.01) |
| *H01L 27/11556* | (2017.01) |
| *H01L 27/11519* | (2017.01) |
| *H01L 27/11582* | (2017.01) |
| *H01L 27/11565* | (2017.01) |
| *H01L 27/1157* | (2017.01) |
| *H01L 27/11524* | (2017.01) |

(52) U.S. Cl.
CPC .... *H01L 27/11556* (2013.01); *H01L 27/1157* (2013.01); *H01L 27/11519* (2013.01); *H01L 27/11524* (2013.01); *H01L 27/11565* (2013.01); *H01L 27/11582* (2013.01)

(58) Field of Classification Search
CPC ......... H01L 27/11526; H01L 27/11286; H01L 27/11573; H01L 27/11582; H01L 27/11519; H01L 27/11556
See application file for complete search history.

(56) References Cited

U.S. PATENT DOCUMENTS

| | | | |
|---|---|---|---|
| 5,270,256 A * | 12/1993 | Bost | H01L 21/768 257/E21.575 |
| 5,362,526 A | 11/1994 | Wang et al. | |
| 7,144,744 B2 | 12/2006 | Lien et al. | |

(Continued)

OTHER PUBLICATIONS

Chang et al., Trench Filling Characteristics of Low Stress TEOS/Ozone Oxide Deposited by PECVD and SACVD, Microsystem Technologies, vol. 10, (2004), pp. 97-102.

(Continued)

*Primary Examiner* — Sarah K Salerno
(74) *Attorney, Agent, or Firm* — TraskBritt

(57) ABSTRACT

A microelectronic device comprises a stack structure comprising a stack structure comprising alternating conductive structures and insulating structures arranged in tiers, each of the tiers individually comprising one of the conductive structures and one of the insulating structures, staircase structures within the stack structure and having steps comprising edges of the tiers, and a doped dielectric material adjacent the steps of the staircase structures and comprising silicon dioxide doped with one or more of boron, phosphorus, carbon, and fluorine, the doped dielectric material having a greater ratio of Si—O—Si bonds to water than borophosphosilicate glass. Related methods of forming a microelectronic device and related electronic systems are also disclosed.

29 Claims, 20 Drawing Sheets

(56) References Cited

U.S. PATENT DOCUMENTS

| | | | |
|---|---|---|---|
| 8,198,669 | B2 | 6/2012 | Omura |
| 8,557,712 | B1 | 10/2013 | Antonelli et al. |
| 8,836,020 | B2 | 9/2014 | Lim et al. |
| 10,147,638 | B1* | 12/2018 | Williamson ........ H01L 23/5283 |
| 10,256,167 | B1 | 4/2019 | Fukuo et al. |
| 10,269,625 | B1 | 4/2019 | Matovn et al. |
| 2012/0009802 | A1* | 1/2012 | LaVoie ................ C23C 16/4554 438/783 |
| 2013/0230987 | A1* | 9/2013 | Draeger ............. H01L 21/0217 438/694 |
| 2014/0339622 | A1 | 11/2014 | Murata et al. |
| 2015/0001728 | A1* | 1/2015 | Chen ................. H01L 21/76883 257/773 |
| 2016/0149002 | A1* | 5/2016 | Sharangpani ..... H01L 27/11578 257/314 |
| 2017/0200736 | A1 | 7/2017 | Park et al. |
| 2018/0366482 | A1* | 12/2018 | Zhou ................ H01L 27/11524 |
| 2019/0148404 | A1 | 5/2019 | Kito et al. |
| 2019/0148506 | A1* | 5/2019 | Kanakamedala ........................... H01L 27/11556 257/315 |

OTHER PUBLICATIONS

Deshmukh et al., Inventigation of SiO2 Plasma Enhanced Chemical Vapor Deposition Through Tetraethoxysilane Using Attenuated Total Reflection Fourier Transform Infrared Spectroscopy, Journal of Vacuum Science & Technology A, vol. 13, (1995), pp. 2355-2367.

Deshmukh et al., Investigation of Low Temperature SiO2 Plasma Enhanced Chemical Vapor Deposition, J. Vac. Sci. Tecnol. B, vol. 14, No. 2, (Mar./Apr. 1996), pp. 738-743.

Fardad, M.A. Catalysts and the Structure of SiO2 Sol-Gel Films, Journal of Materials Science, vol. 35, (2000), pp. 1835-1841.

Foggiato, John, Chemical Vapor Deposition of Silicon Dioxide Films, Chapter 3 of CVD of Silicon Dioxide Films, (2001), pp. 111-150.

Mahajan et al., Growth of SiO2 Films by TEOS-PECVD System for Microelectronics Applications, Surface and Coatings Technology, vol. 183, (2004), . 295-300.

Mahajan et al., TEOS-PECVD System for High Growth Rate Deposition of SiO2 Films, Vacuum, vol. 79. (2005), pp. 194-202.

* cited by examiner

MICROELECTRONIC DEVICES INCLUDING STAIR STEP STRUCTURES, AND RELATED ELECTRONIC DEVICES AND METHODS

TECHNICAL FIELD

The disclosure, in various embodiments, relates generally to the field of microelectronic device design and fabrication. More specifically, the disclosure relates to microelectronic devices including staircase structures, and to related electronic systems and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. As the number of memory cells in such vertical memory arrays increases, such as by increasing the number of memory cells in vertical strings of the vertical memory arrays, a depth (e.g., a height) of the stair step structure increases. In other words, the distance (the vertical distance, the horizontal distance) between, for example, a lowermost step and an uppermost step may increase as the number of memory cells in the vertical memory array increases. In addition, as the number of steps increases, a distance between regions of opposing stair step structures may exhibit a similar increase.

Increases in depths of stair step structures and increases in distances between regions of opposing stair step structures present problems in filling openings adjacent the stair step structures with an insulative material. Unfortunately, the increased depth and volume of the insulative material may have undesired consequences during fabrication of the microelectronic device. For example, as stair case structures become deeper, formation and patterning of the insulative material may require significant volumes of the insulative material. However, as the volume of the insulative material increases, issues such as the large volume of material that has to be removed and patterned (e.g., exposed to a chemical mechanical planarization process), shrinkage and delamination of the insulative material, residual stresses within the insulative material, contact misalignment resulting from shrinkage of the insulative material, and outgassing of various materials (e.g., moisture) from the insulative material become problematic.

DETAILED DESCRIPTION

Figure 1:
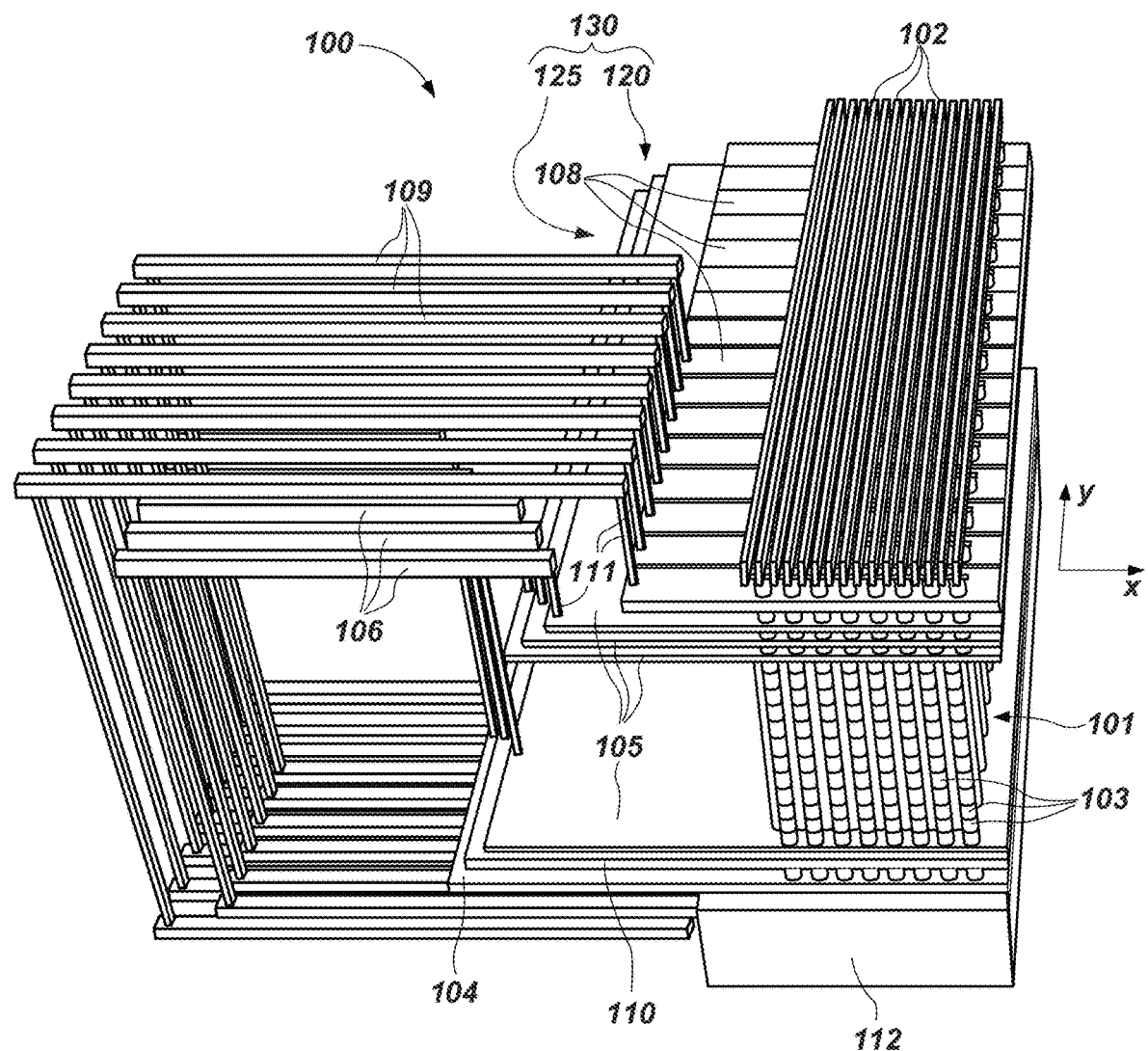
FIG. 1 is a partial cutaway perspective view of a portion of a microelectronic device, according to embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a 3D NAND Flash memory device) or a complete microelectronic device including an insulative material between stair step structures. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" refers to one or more of a metal, such as tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride), metal silicides (tantalum silicides, tungsten silicides, nickel silicides, titanium silicides), metal carbides, metal oxides (iridium oxide, ruthenium oxide)), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide (IrOx), elemental ruthenium (Ru), ruthenium oxide (RuOx), elemental tungsten (W), aluminum (Al), elemental copper (Cu), elemental gold (Au), elemental silver (Ag), polysilicon, alloys thereof, or combinations thereof. The terms "electrically conductive material" and "conductive material" may be used interchangeably herein.

As used herein, the terms "stair step" structure and "staircase" structure are used interchangeably.

According to embodiments described herein, a method of forming a microelectronic device including a stack structure including tiers comprising vertically alternating conductive structures and insulative structures, and at least one stair step structure defined by horizontal ends of the tiers is described. After forming the stack structure, an insulative region comprising at least a doped dielectric material is formed adjacent to the stair step structure(s) thereof, such as between steps of the opposing stair step structures of the stack structure. For example, the doped dielectric material may be disposed within one or more stadium structures of the stack structure, wherein the stadium structures each individually include opposing stair step structures (e.g., a first stair step structures having a positive slope, and a second, opposing stair step structure having a negative slope). The doped dielectric material may be formed by plasma enhanced chemical vapor deposition using a precursor comprising tetraethyl orthosilicate and an oxygen source, such as oxygen gas ($O_2$), ozone, or both. The doped dielectric material may be formed in the presence of one or more dopant precursors, such as precursors of one or more of boron, phosphorus, fluorine, and carbon to form the doped dielectric material doped with one or more of the boron, phosphorus, fluorine, and carbon.

The doped dielectric material, due to the presence of the one or more dopants and the method by which the doped dielectric material is formed, may exhibit improved properties relative to conventional dielectric materials, such as thermally grown silicon dioxide or silicate glasses (such as borosilicate glass (BSG), phosphosilicate glass (PSG), or borophosphosilicate glass (BPSG)). The doped dielectric material may be suitable for large gap fill applications (areas where substantial volumes of insulative materials are desired). The doped dielectric material may exhibit a high step coverage and may be suitable for high aspect ratio (e.g., aspect ratios greater than about 10:1) applications. The doped dielectric material may exhibit a higher chemical mechanical planarization rate than conventional dielectric materials and a faster deposition rate than conventional dielectric materials, facilitating faster throughput and fabrication compared to conventional dielectric materials. The doped dielectric material may exhibit a compressive stress and may not exhibit stress hysteresis responsive to exposure to elevated temperatures. In some embodiments, the doped dielectric material exhibits less tensile stress than conventional dielectric materials. The doped dielectric material may exhibit a substantially lower change in volume (e.g., shrinkage) responsive to exposure to thermal cycling (e.g., exposure to elevated temperatures followed by cooling) compared to conventional dielectric materials. In some embodiments, the doped dielectric material may include a hydrophobic surface and exhibit less moisture outgassing than conventional dielectric materials. The doped dielectric material may be substantially free of Si—OH bonds and may exhibit a higher ratio of Si—O—Si bonds to water than conventionally formed BPSG. Accordingly, the doped dielectric material may be used to fill large volumes of insulative regions adjacent to stair step structures, such as within valleys in stair case stadia.

FIG. 1 is a partial cutaway perspective view of a portion of a microelectronic device 100 (e.g., a vertical memory device, such as a 3D NAND Flash memory device), according to embodiments of the disclosure. The microelectronic device 100 includes a stair step structure 120 for defining contact regions for connecting access lines 106 to conductive tiers 105 (e.g., conductive layers, conductive plates, etc.). The microelectronic device 100 may include vertical strings 101 of memory cells 103 that are coupled to each other in series. The vertical strings 101 may extend vertically and orthogonally to conductive lines and tiers 105, such as data lines 102, a source tier 104, the conductive tiers 105, the access lines 106, first select gates 108 (e.g., upper select gates, drain select gates (SGDs)), select lines 109, and a second select gate 110 (e.g., a lower select gate, a source select gate (SGS)).

Vertical conductive contacts 111 may electrically couple components to each other as shown. For example, the select lines 109 may be electrically coupled to the first select gates 108 and the access lines 106 may be electrically coupled to the conductive tiers 105. The microelectronic device 100 may also include a control unit 112 positioned under the memory array, which may include at least one of string driver circuitry, pass gates, circuitry for selecting gates, circuitry for selecting conductive lines (e.g., the data lines 102, the access lines 106, etc.), circuitry for amplifying signals, and circuitry for sensing signals. The control unit 112 may be electrically coupled to the data lines 102, the source tier 104, the access lines 106, the first select gates 108, and the second select gates 110, for example.

The first select gates 108 may extend horizontally in a first direction x (e.g., to the left and right from the perspective of FIG. 1) and may be coupled to respective first groups of vertical strings 101 of memory cells 103 at a first end (e.g., an upper end) of the vertical strings 101. The second select gate 110 may be formed in a substantially planar configuration and may be coupled to the vertical strings 101 at a second, opposite end (e.g., a lower end) of the vertical strings 101 of memory cells 103.

The data lines 102 (e.g., bit lines) may extend horizontally in a second direction y (e.g., up and down from the perspective of FIG. 1) that is at an angle (e.g., perpendicular) to the first direction in which the first select gates 108 extend. The data lines 102 may be coupled to respective second groups of the vertical strings 101 at the first end (e.g., the upper end) of the vertical strings 101. A first group of vertical strings 101 coupled to a respective first select gate 108 may share a particular vertical string 101 with a second group of vertical strings 101 coupled to a respective data line 102. Thus, a particular vertical string 101 may be selected at an intersection of a particular first select gate 108 and a particular data line 102.

The conductive tiers 105 (e.g., word line plates) may extend in respective horizontal planes. The conductive tiers 105 may be stacked vertically, such that each conductive tier 105 is coupled to all of the vertical strings 101 of memory cells 103, and the vertical strings 101 of the memory cells 103 extend vertically through the stack of conductive tiers 105. The conductive tiers 105 may be coupled to or may form control gates of the memory cells 103 to which the conductive tiers 105 are coupled. Each conductive tier 105 may be coupled to one memory cell 103 of a particular vertical string 101 of memory cells 103.

The first select gates 108 and the second select gates 110 may operate to select a particular vertical string 101 of the memory cells 103 between a particular data line 102 and the source tier 104. Thus, a particular memory cell 103 may be selected and electrically coupled to a data line 102 by operation of (e.g., by selecting) the appropriate first select gate 108, second select gate 110, and conductive tier 105 that are coupled to the particular memory cell 103.

The stair step structure 120 may be configured to provide electrical connection between the access lines 106 and the tiers 105 through the vertical conductive contacts 111. In other words, a particular level of the tiers 105 may be selected via an access line 106 in electrical communication with a respective conductive contact 111 in electrical communication with the particular tier 105.

As will be described herein, a microelectronic device structure 130 of the microelectronic device 100 may include a stack structure 125 including the stair step structures 120 at horizontal ends of tiers (e.g., tiers 336 (FIG. 3F)) thereof, and a doped dielectric material (e.g., doped dielectric material 322 (FIG. 3C through FIG. 3F)) adjacent the stair step structure 120, as will be described in further detail below.

Figure 2:
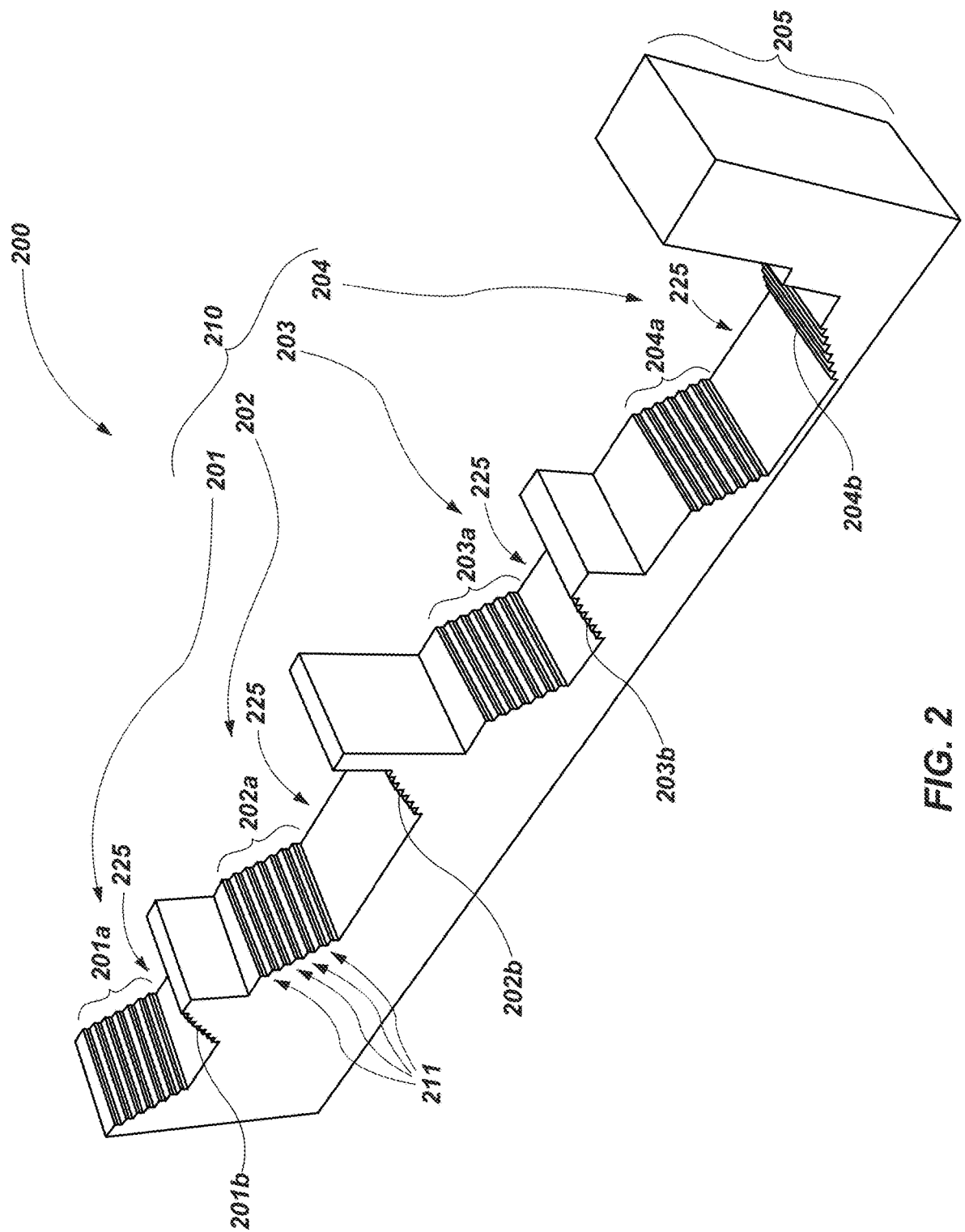
FIG. 2 is a simplified perspective view of a microelectronic device structure of the microelectronic device shown in FIG. 1, in accordance with embodiments of the disclosure.

FIG. 2 is a simplified perspective view of a microelectronic device structure 200, in accordance with embodiments of the disclosure. The microelectronic device structure 200 may, for example, be employed as the microelectronic device structure 130 in the microelectronic device 100 previously described with reference to FIG. 1. As shown in FIG. 2, the microelectronic device structure 200 may include one or more stair step structures 210. Steps 211 of the stair step structure(s) 210 of the microelectronic device structure 200 may serve as contact regions for different tiers (e.g., conductive tiers 105 (FIG. 1)) of conductive materials of the stack structure 205 (e.g., the stack structure 125 of the microelectronic device structure 130 of the microelectronic device 100 described with reference to FIG. 1). The stair step structure(s) 210 may include, for example, a first stair step structure 201a, a second stair step structure 202a, a third stair step structure 203a, and a fourth stair step structure 204a at different elevation (e.g., vertical positions) than one another within the stack structure 205. In addition, the stair step structures 210 may further include another first stair step structure 201b opposing and at the same elevation as the first stair step structure 201a, another second stair step structure 202b opposing and at the same elevation as the second stair step structure 202b, another third stair step structure 203b opposing and at the same elevation as the third stair step structure 203b, and another fourth stair step structure 204b opposing and at the same elevation as the fourth stair step structure 204b. Each of the first stair step structure 201a, the second stair step structure 202a, the third stair step structure 203a, and the fourth stair step structure 204a may individually exhibit a generally negative slope; and each of the another first stair step structure 201b, the another second stair step structure 202b, the another third stair step structure 203b, and the another fourth stair step structure 204b may individually exhibit a generally positive slope. As shown in FIG. 2, the first stair step structure 201a and the another first stair step structure 201b may form a first stadium structure 201, the second stair step structure 202a and the another second stair step structure 202b may form a second stadium structure 202, the third stair step structure 203a and the another third stair step structure 203b may form a third stadium structure 203, and the fourth stair step structure 204a and the another fourth stair step structure 204b may form a fourth stadium structure 204.

As described above, an electrically conductive contact (e.g., a vertical contact 111 (FIG. 1)) may be formed to the electrically conductive portion of each tier of the stack structure 205 of the microelectronic device structure 200. As will be described herein, the electrically conductive contacts may be electrically isolated from each other with a doped dielectric material that fills valleys 225 (e.g., spaces, regions) opposing stair step structures 210 (e.g., valleys 225 defined by stadium structures 201, 202, 203, 204) of the stack structure 205 of the microelectronic device structure 200. As a number of stair steps 211 increases, the depth of the stadium structures 201, 202, 203, 204 and the corresponding valleys 225 between the stadium structures 201, 202, 203, 204 may exhibit a corresponding increase. However, as the depth increases, a difficulty of patterning insulative materials within the stadium structures 201, 202, 203, 204 (e.g., between the first stair step structure 201a and the another first stair step structure 201b, between the second stair step structure 201b and the another second stair step structure 202b, between the third stair step structure 201c and the another third stair step structure 202c, and between the fourth stair step structure 201d and the another fourth stair step structure 202d) may increase.

As will be understood by those of ordinary skill in the art, although the microelectronic device structure 130 (FIG. 1) and the microelectronic device structure 200 (FIG. 2) have been described as having particular structures, the disclosure is not so limited and the microelectronic device structures 130, 200 may have different geometric configurations and orientations.

FIG. 3A through FIG. 3F are partial cross-sectional views illustrating a method of forming a microelectronic device structure 300, in accordance with embodiments of the disclosure. The microelectronic device structure 300 may comprise, for example, the microelectronic device structure 200 previously described with reference to FIG. 2. One of ordinary skill in the art will appreciate that only a portion of the microelectronic device structure 300 is depicted in FIG. 3A through FIG. 3F. Accordingly, processing similar to or different than that illustrated in FIG. 3A through FIG. 3F may be performed on other regions of the microelectronic device structure 300 (e.g., to form the microelectronic device structure 200 previously described with reference to FIG. 2), as desired.

Figure 3A:
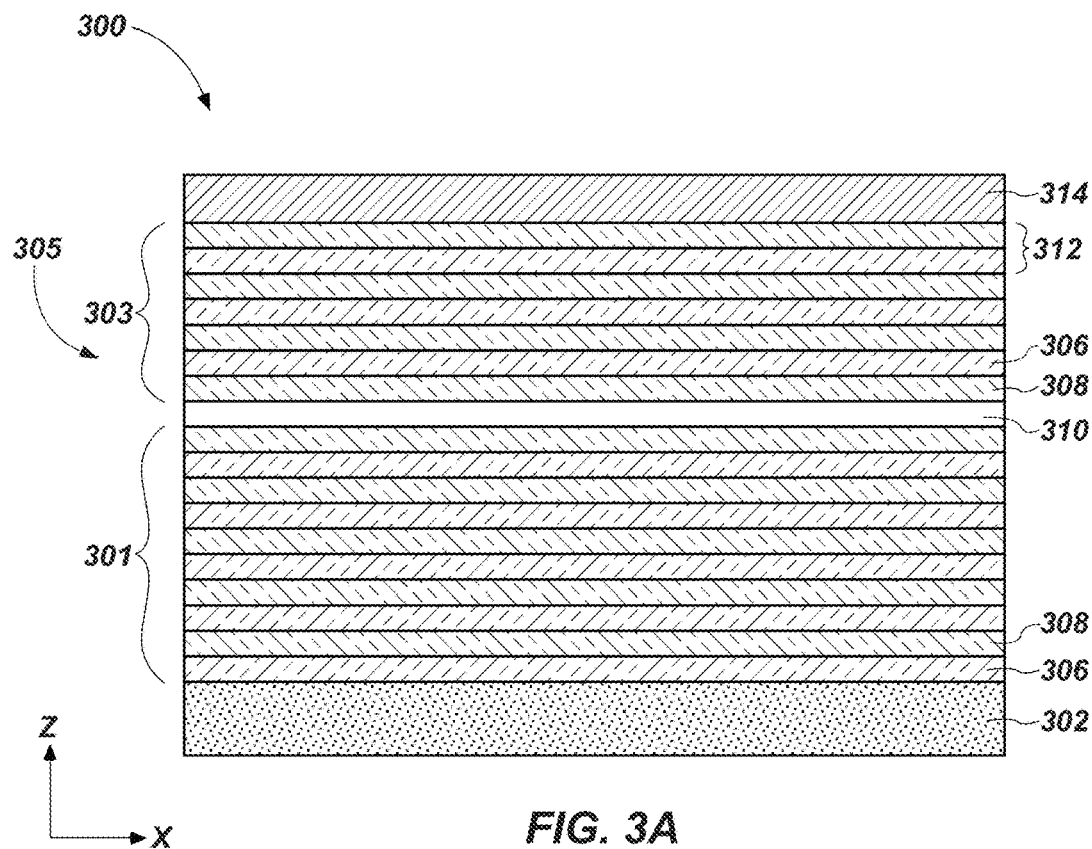
FIG. 3A through FIG. 3F illustrate a method of forming a microelectronic device structure, in accordance with embodiments of the disclosure.

FIG. 3A is a simplified cross-sectional view of a microelectronic device structure 300 including a stack structure 305 comprising a vertically alternating (e.g., in z-direction) sequence of insulative materials 306 and other insulative materials 308 over a source structure 302 (e.g., a common source plate (CSP)).

The stack structure 305 may include tiers 312 of the insulative material 306 and the other insulative material 308. Each of the tiers 312 may include at least one (1) of the insulative materials 306 and at least one (1) of the other insulative materials 308.

Although FIG. 3A illustrates a particular number (e.g., quantity) of tiers 312, the disclosure is not so limited. The stack structure 305 may include any a desired quantity of the tiers 312. In some embodiments, the stack structure 305 includes thirty-two (32) tiers 312. In other embodiments, the stack structure 305 includes a different number of tiers 312, such as less than thirty-two (32) of the tiers 312 (e.g., less than or equal to thirty (30) of the tiers 312, less than or equal to twenty (20) of the tiers 312, less than or equal to ten (10) of the tiers 312); or greater than thirty-two (32) of the tiers 312 (e.g., greater than or equal to fifty (50) of the tiers 312, greater than or equal to one hundred (100) of the tiers 312 312) of the insulative material 306 and the other insulative material 308.

The stack structure 305 may include a first deck structure 301 and a second deck structure 303 separated from the first deck structure 301 by an insulative material 310, which may also be referred to herein as an inter-deck oxide. The insulative material 310 may comprise an oxide material such as, for example, silicon dioxide, aluminum oxide, or another material. In some embodiments, the insulative material 310 has a different material composition than the insulative material 306 and the other insulative material 308. In other embodiments, the insulative material 310 has substantially the same material composition as the insulative material 306.

The insulative material 306 may include, for example, one or more of an oxide material (e.g., silicon dioxide ($SiO_2$), PSG, BSG, BPSG, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative material 306 is formed of and includes silicon dioxide.

The other insulative material 308 may include an insulative material exhibiting an etch selectivity with respect to the insulative material 306. The other insulative material 308 may include, for example, a nitride material (e.g., silicon nitride ($Si_3N_4$)), an oxynitride material (e.g., silicon oxynitride). In some embodiments, the other insulative material 308 comprises a nitride material, such as silicon nitride.

A lowermost one of the insulative materials 306 may be located adjacent the source structure 302. As will be described herein, during fabrication of microelectronic device structure 300, a portion of the lowermost other insulative material 308 may be replaced to form conductive structures, such as select gate structures 338 (FIG. 3F), which may comprise a select gate source (SGS) structure.

A sacrificial material 314, which may serve as a mask material, may overlie an uppermost tier 312 of the stack structure 305. The sacrificial material 314 may exhibit an etch selectivity relative to the insulative material 306 and the other insulative material 308. The sacrificial material 314 may include, by way of non-limiting example, one or more of polysilicon, a dielectric material, a nitride material (e.g., silicon nitride), a metal oxide (e.g., aluminum oxide, titanium oxide, tantalum oxide, tungsten oxide). In some embodiments, the sacrificial material 314 comprises polysilicon.

Figure 3B:
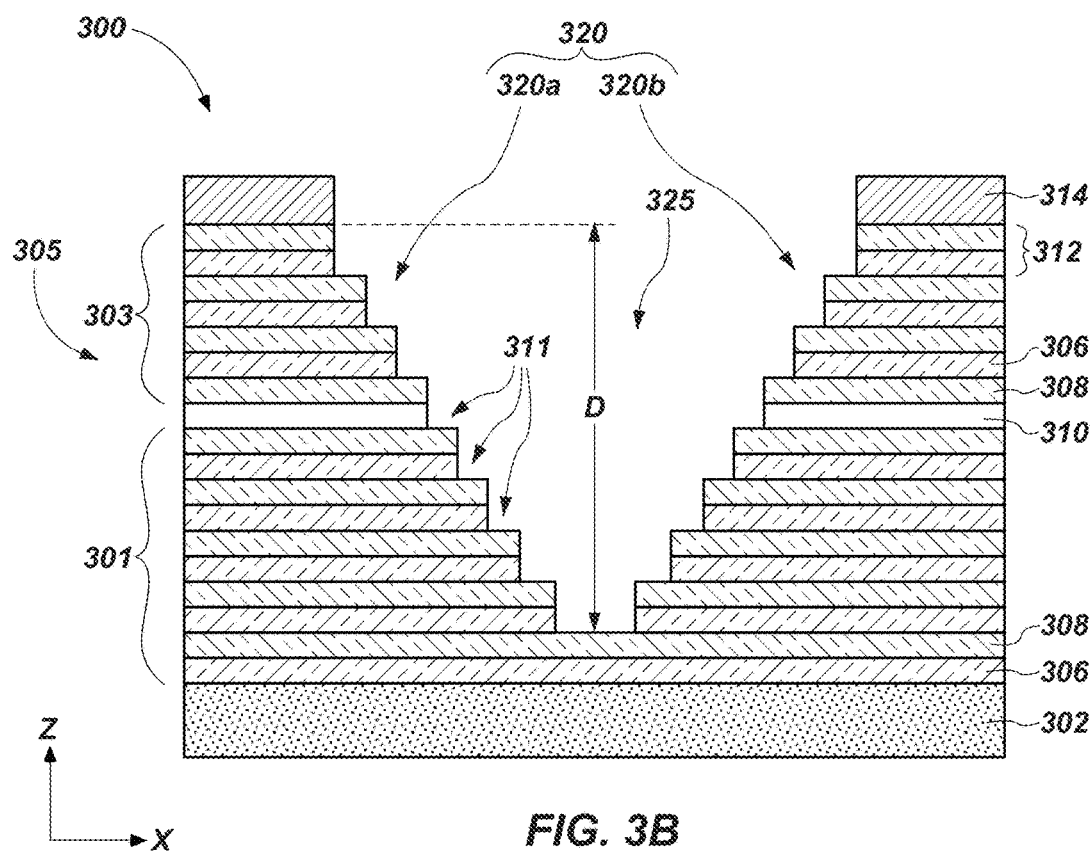

Referring to FIG. 3B, a portion of the sacrificial material 314 may be patterned to form an opening in the sacrificial material 314 and expose at least a portion of the uppermost tier 312 of the stack structure 305. The uppermost tier 312 may be exposed to etch chemistries through the opening to remove portions of the uppermost tier 312 (including portions of the insulative material 306 and the other insulative material 308 thereof) exposed through the opening. After removing the exposed portions of the uppermost tier 312 through the opening, the sacrificial material 314 may be exposed to a trim chemistry to remove additional portions of the sacrificial material 314 and expose additional portions of the uppermost tier 312 corresponding to a desired width (in the x-direction) of steps 311 of opposing stair step structures to be formed. After exposing new portions of the uppermost tier 312, the stack structure 305 is exposed to etch chemistries to remove portions of another tier 312 through the enlarged opening in the sacrificial material 314 and form another step 311. The process of trimming the sacrificial material 314 and etching the tiers 312 may be repeated a desired number of times to form a stadium structure 320 including a stair step structure 320a and another stair step structure 320b. The stair step structure 320a may exhibit a negative slope, and the another stair step structure 320b may oppose (e.g., mirror) the stair step structure 320a and may exhibit a positive slope. The stadium structure 320 may, for example, correspond to one of the stadium structures 201, 202, 203, 204 previously described with reference to FIG. 2.

The stair step structure 320a and the another stair step structure 320b of the stadium structure 320 may be separated from one another by a valley 325 (e.g., space, gap, trench, opening). A depth D of the valley 325 may depend on a number of the opposing steps 311 of the stadium structure 320. The depth D may be within a range from about 3 micrometers (μm) and about 20 μm, such as from about 3 μm to about 6 μm, from about 6 μm to about 9 μm, from about 9 μm to about 12 μm, from about 12 μm to about 15 μm, or from about 15 μm to about 20 μm. In some embodiments, the depth D is greater than or equal to about 8 μm, greater than or equal to about 10 μm, greater than or equal to about 15 μm, or greater than or equal to about 20 μm.

Figure 3C:
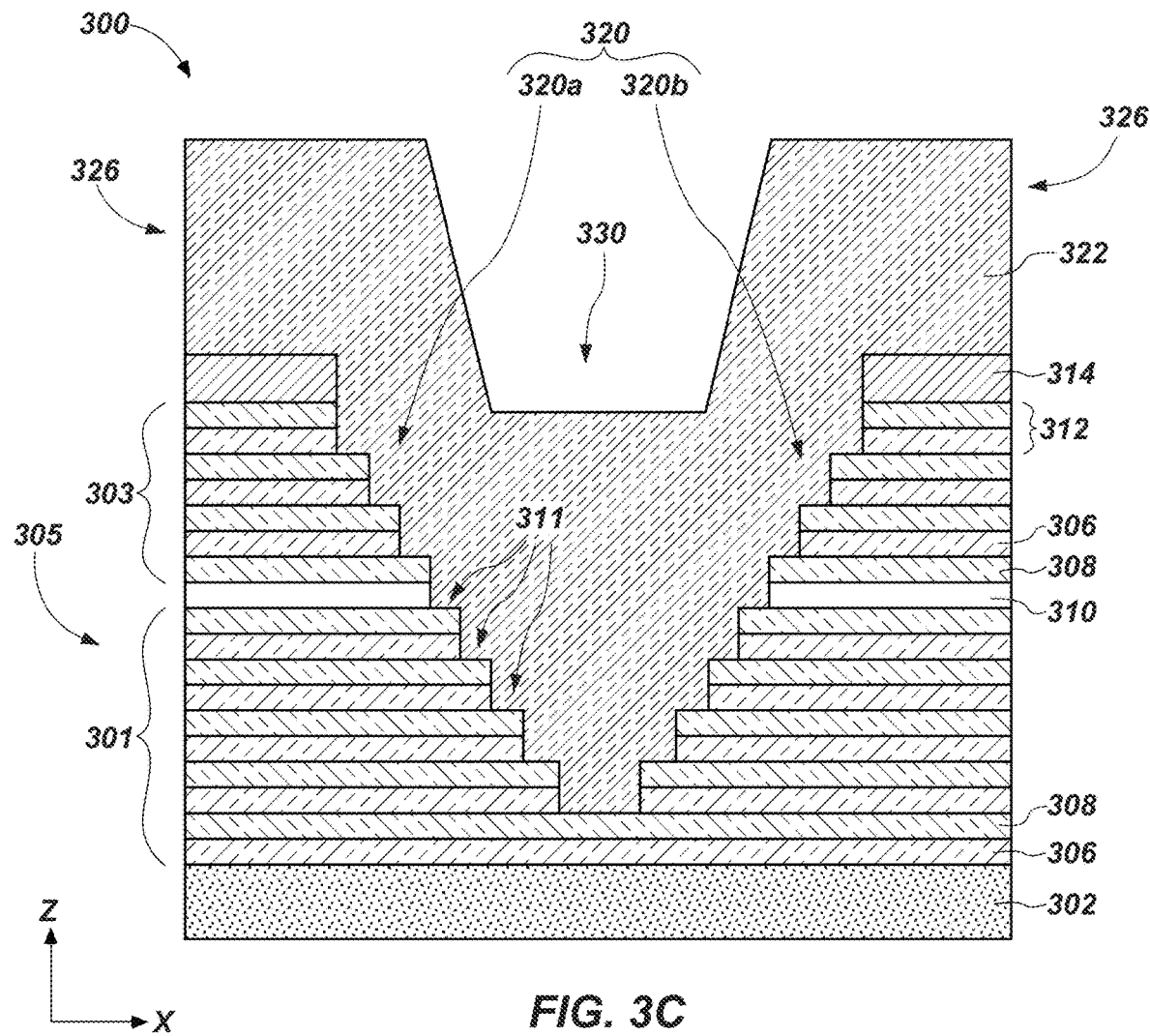

With reference to FIG. 3C, a doped dielectric material 322 may be formed over the stack structure 305 and within the valley 325 (FIG. 3B). In some embodiments, the doped dielectric material 322 conformally overlies the stack structure 305. The doped dielectric material 322 may include a recessed portion 330 within horizontal boundaries of the valley 325 (FIG. 3B).

The doped dielectric material 322 may comprise an electrically insulative material. As will be described herein, in some embodiments, the doped dielectric material 322 comprises silicon dioxide formed with tetraethyl orthosilicate (TEOS) ($Si(OC_2H_5)_4$) by plasma enhanced chemical vapor deposition (PECVD), and may be referred to herein as a doped TEOS oxide, doped TEOS silicon dioxide, PECVD doped TEOS oxide, or PECVD doped TEOS silicon dioxide.

The doped dielectric material 322 may be doped with one or more dopants selected from phosphorus, boron, carbon, and fluorine. In some embodiments, the doped dielectric material 322 is doped with two or more (e.g., two, three, four) of phosphorus, boron, carbon, and fluorine. By way of non-limiting example, the doped dielectric material 322 may be doped with boron and phosphorus and may comprise boron-phosphorus doped TEOS silicon dioxide. In other embodiments, the doped dielectric material 322 is doped with only one of phosphorus, boron, carbon, and fluorine. In yet other embodiments, the doped dielectric material 322 is doped with fluorine and carbon.

The doped dielectric material 322 may include from about 0.01 weight percent to about 10 weight percent of the one or more dopants. In other words, the one or more dopants may constitute from about 0.01 weight percent to about 10 weight percent of the doped dielectric material 322. For example, the one or more dopants may constitute from about 0.1 weight percent to about 0.5 weight percent, from about 0.5 weight percent to about 1.0 weight percent, from about 1.0 weight percent to about 2.0 weight percent, from about 2.0 weight percent to about 3.0 weight percent, from about 3.0 weight percent to about 4.0 weight percent, from about 4.0 weight percent to about 6.0 weight percent, from about 6.0 weight percent to about 8.0 weight percent, or from about 8.0 weight percent to about 10.0 weight percent of the doped dielectric material 322. In some embodiments, the one or more dopants are present in the doped dielectric material 322 within a range from about 0.1 weight percent to about 4.0 weight percent. In other embodiments, the one or more dopants are present in the doped dielectric material 322 within a range from about 4.0 weight percent to about 8.0 weight percent. In some embodiments, the one or more dopants are present in the doped dielectric material 322 within a range from about 1.0 weight percent to about 8.0 weight percent.

In some embodiments, the doped dielectric material 322 comprises from about 0.1 weight percent to about 4.0 weight percent boron and from about 0.1 weight percent to about 4.0 weight percent phosphorus. In other embodiments, the dopant consists essentially of carbon and is substantially free of other dopants (e.g., phosphorus, boron, and fluorine). In yet other embodiments, the dopant consists essentially of fluorine and is substantially free of other dopants (e.g., phosphorus, boron, and carbon).

In some embodiments, the doped dielectric material 322 comprises carbon and fluorine. In some such embodiments, the doped dielectric material 322 includes from about 0.1 weight percent to about 4.0 weight percent carbon, and from about 0.1 weight percent to about 4.0 weight percent fluorine.

In some embodiments, a concentration of the one or more dopants in the doped dielectric material 322 is substantially uniform throughout the doped dielectric material 322. In other embodiments, the doped dielectric material 322 exhibits a gradient of the one or more dopants. In some such embodiments, and with reference to FIG. 3C, a concentration of the one or more dopants may increase with a distance from the edges of the tiers 312 and with a distance from an upper portion of the doped dielectric material 322. In other words, a concentration of the one or more dopants in the doped dielectric material 322 may be greatest proximate a central (e.g., vertically central and horizontally central) portion of the doped dielectric material 322. A concentration of the one or more dopants may decrease with an increasing distance from the center of the doped dielectric material 322. In some embodiments, exposed surfaces of the doped dielectric material 322 and surfaces of the doped dielectric material 322 interfacing with other materials have a relatively low concentration (e.g., about 0 weight percent) of the one or more dopants while central portions (e.g., vertically central and horizontally central) of the doped dielectric material 322 exhibit a greater concentration of the one or more dopants.

In some embodiments, a concentration of boron is greater proximate an interface of the doped dielectric material 322 with the edges of the tiers 312 of the insulative materials 306 and the other insulative materials 308 than at other portions of the doped dielectric material 322. In some such embodiments, a concentration of boron decreases with an increasing distance from the interface of the doped dielectric material 322 with the edges of the tiers 312 and the doped dielectric material 322 exhibits a minimum concentration of the boron proximate a central portion (e.g., vertically central and horizontally central) thereof. A concentration of boron may increase proximate exposed surfaces 324 of the doped dielectric material 322 (e.g., exposed surfaces 324 (FIG. 3D)). A concentration of at least another dopant (e.g., one or more of phosphorus, fluorine, and carbon) may increase with an increasing distance from the edges of the tiers 312 and the exposed surfaces of the doped dielectric material 322. The at least another dopant may have a maximum concentration proximate central portions (e.g., vertically central and horizontally central) of the doped dielectric material.

The doped dielectric material 322 may have a density within a range from about 2.10 g/cm$^3$ to about 2.16 g/cm$^3$, such as from about 2.10 g/cm$^3$ to about 2.12 g/cm$^3$, from about 2.12 g/cm$^3$ to about 2.14 g/cm$^3$, or from about 2.14 g/cm$^3$ to about 2.16 g/cm$^3$. greater than about 2.11 g/cm$^3$, such as greater than about 2.12 g/cm$^3$, greater than about 2.13 g/cm$^3$, greater than about 2.14 g/cm$^3$, greater than about 2.15 g/cm$^3$, or greater than about 2.16 g/cm$^3$. In some embodiments, the doped dielectric material 322 has a density greater than a density of BPSG. In some embodiments, the doped dielectric material 322 has a density within a range from 2.12 g/cm$^3$ to 2.14 g/cm$^3$. By way of comparison, BPSG may have a density of 2.11 g/cm$^3$.

In some embodiments, the doped dielectric material 322 exhibits a relatively more hydrophobic surface compared to conventional dielectric materials. The doped dielectric material 322 may include relatively fewer Si—OH bonds as compared to conventional dielectric materials. For example, the doped dielectric material 322 may exhibit fewer Si—OH bonds than silicon dioxide formed by PECVD using TEOS. As one example, the doped dielectric material 322 may be substantially free of Si—OH bonds and may exhibit a lower ratio of water to Si—O—Si bonds relative to other dielectric materials, such as conventionally formed BPSG.

In some embodiments, the doped dielectric material 322 includes a greater amount of carbon (e.g., from about 4 times to about 5 times as much) than BSPG. In addition, the doped dielectric material 322 includes a greater amount of hydrogen proximate exposed surfaces thereof than BPSG. The doped dielectric material 322 includes a greater amount of nitrogen proximate the exposed surfaces thereof compared to BPSG and to silicon dioxide formed by PECVD using TEOS.

The doped dielectric material 322 may be formed by one or more of atomic layer deposition (ALD), physical vapor deposition (PVD), chemical vapor deposition (CVD), low pressure chemical vapor deposition (LPCVD), and PECVD. In some embodiments, the doped dielectric material 322 is formed by PECVD.

In some embodiments, the dielectric material comprises doped TEOS silicon dioxide formed by PECVD. In some such embodiments, the doped dielectric material 322 is formed in a PECVD tool. The PECVD tool may include a power source (e.g., a radiofrequency (RF) power source, a pulsed DC power source, a variable DC power source) for generating a plasma from one or more reactant materials, which may also be referred to herein as precursors. For example, a top electrode of the PECVD tool may be coupled to the power source. Power may be applied through the top electrode (which may comprise a so-called "showerhead") through which reactants, from which the plasma is generated, are introduced into the PECVD chamber. A lower electrode of the PECVD tool may be coupled to an electrical ground. In other embodiments, the lower electrode is coupled to a low frequency power source (e.g., a low frequency RF source). The device on which the doped dielectric material 322 is to be formed may be disposed on the lower electrode.

A power of the PECVD tool may be within a range from about 20 Watts (W) to about 600 W, such as from about 20 W to about 50 W, from about 50 W to about 100 W, from about 100 W to about 200 W, from about 200 W to about 300 W, from about 300 W to about 400 W, or from about 400 W to about 500 W. However, the disclosure is not so limited and the RF power to form the doped dielectric material 322 may be different than those described.

The temperature of the PECVD chamber may be within a range from about 350° C. to about 650° C., such as from about 350° C. to about 400° C., from about 400° C. to about 450° C., from about 450° C. to about 500° C., from about 500° C. to about 550° C., from about 550° C. to about 600° C., or from about 600° C. to about 650° C. during formation of the doped dielectric material 322. In some embodiments, the doped dielectric material 322 is formed at a temperature within a range from about 350° C. to about 400° C.

The doped dielectric material 322 may be formed at a pressure within a range from about 5 mTorr to about 760 Torr. For example, the pressure may be within a range from about 5 mTorr to about 10 mTorr, from about 10 mTorr to about 100 mTorr, from about 100 mTorr to about 1 Torr, from about 1 Torr to about 20 Torr, from about 20 Torr to about 100 Torr, or from about 100 Torr to about 760 Torr. However, the disclosure is not so limited and the pressure within the PECVD chamber may be different than those described.

The plasma may comprise a plasma of various reactants used to form (e.g., deposit) the doped dielectric material 322. In some embodiments, a reactant gas comprising, for example, TEOS, an oxygen source (e.g., one or more of oxygen, ozone), and a carrier gas (e.g., argon, helium) is introduced into the PECVD tool to form the plasma. In some embodiments, the reactant gases comprise TEOS, oxygen, and argon.

In some embodiments, the plasma further includes one or more dopant-containing precursors. The one or more dopant-containing precursors may be introduced into the PECVD chamber concurrently with the TEOS. A concentration of the dopant within the doped dielectric material 322 may be determined by the flow rate of the dopant-containing precursors within the PECVD chamber. In addition, the flow rate of the dopant-containing precursors may be pulsed to control the location of the one or more dopants within the resulting doped dielectric material 322. In some embodiments, the flow rate of different dopant-containing precursors may be pulsed at different times to form a gradient of the different dopants within the doped dielectric material 322. For example, a flow rate of a first dopant-containing precursor may be decreased while a flow rate of a second, different dopant-containing precursor is increased to alter the weight percent of the first and second dopant within the doped dielectric material 322.

In some embodiments where the doped dielectric material 322 includes boron, a boron-containing precursor is introduced into the PECVD chamber concurrently with the TEOS. The boron-containing precursor may include triethylborane (TEB) ($(C_2H_5)_3B$), triethyelborate ($C_6H_{15}BO_3$), trimethylborate ($C_3H_9BO_3$), cyanoborane, diborane ($B_2H_6$), decaborane, or another source of boron. A flow rate of the boron-containing precursor may be selected to adjust a weight percent of the boron in the doped dielectric material 322.

In some embodiments where the doped dielectric material 322 includes phosphorus, a phosphorus-containing precursor is introduced into the PECVD chamber concurrently with the TEOS. Nonlimiting examples of phosphorous-containing precursors include one or more of triethyl phosphate (TEPO) ($(C_2H_5)_3PO_4$), trimethyl phosphate ($(OCH_3)_3P$) (TMPO), phosphine ($PH_3$), and trimethylphosphite ($C_3H_9O_3P$) (TMPI). In some embodiments, the phosphorous-containing precursor comprises TEPO.

In some embodiments where the doped dielectric material 322 includes fluorine, a fluorine-containing precursor is introduced into the PEVCD chamber concurrently with the TEOS. The fluorine-containing precursor may comprise one or both of at least one fluorocarbon (e.g., tetrafluoromethane ($CF_4$), hexafluoroethane ($C_2F_6$), octafluoropropane ($C_3F_8$)), or nitrogen trifluoride ($NF_3$). In some embodiments, the fluorine-containing precursor comprises one or both of tetrafluoromethane and hexafluoroethane.

In some embodiments where the doped dielectric material 322 includes carbon, a carbon-containing precursor is introduced into the PECVD chamber concurrently with the TEOS. By way of nonlimiting example, the carbon-containing precursor may comprise tetramethylcyclotetrasiloxane (TMCTS) or octamethylcyclotetrasiloxane (OMCTS). In some embodiments, the carbon-containing precursor comprises TMCTS.

In some embodiments, the concentration of the one or more dopants within the doped dielectric material 322 may be controlled by adjusting the amount (e.g., the flow rate, the partial pressure of) the one or more dopant precursors in the PECVD chamber during formation of the doped dielectric material 322.

Figure 3D:
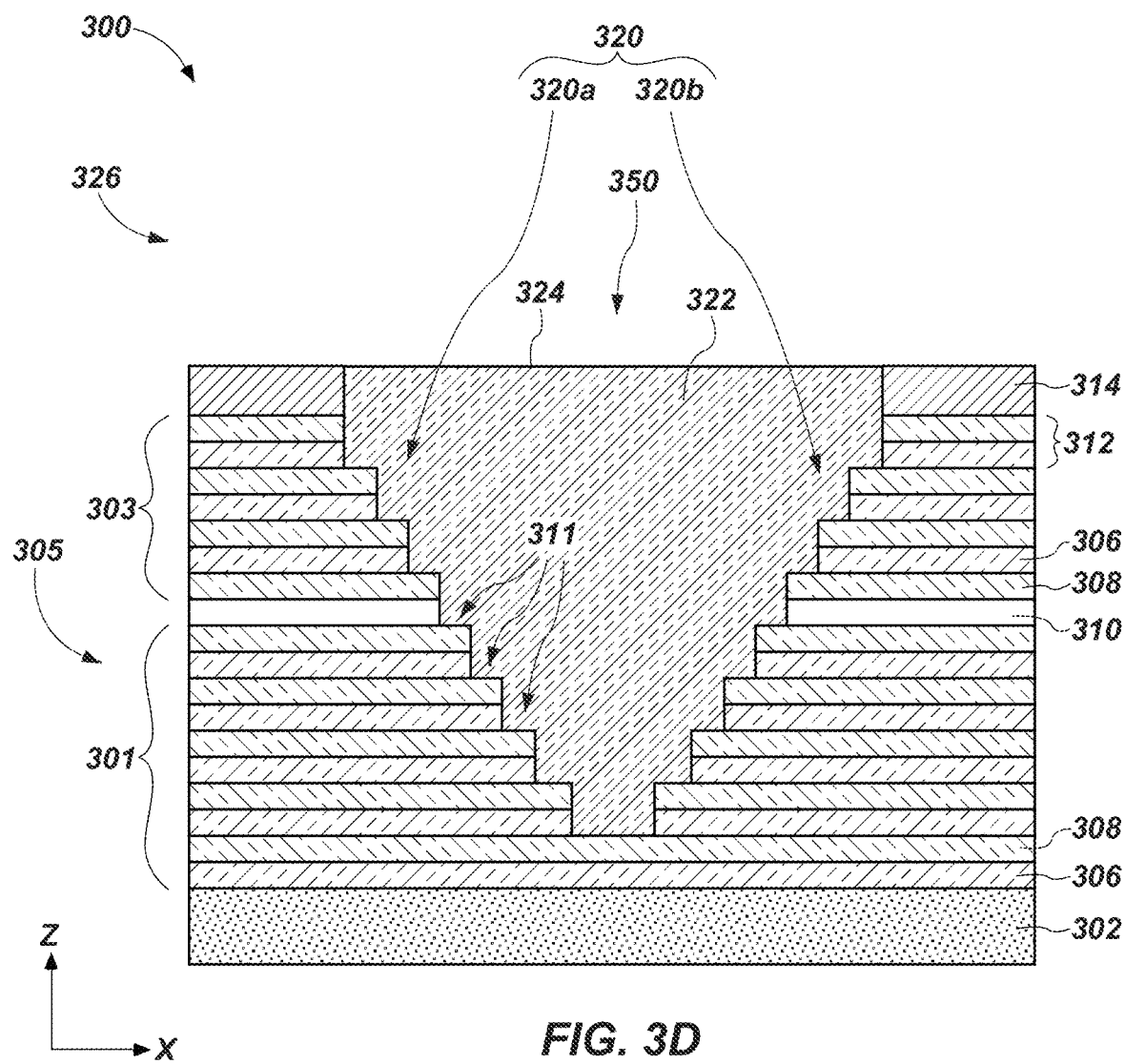

With continued reference to FIG. 3C, filling the valley 325 (FIG. 3B) with the doped dielectric material 322 may include forming overburden regions 326 of the doped dielectric material 322 which may be removed during subsequent processing acts. Referring to FIG. 3D, the doped dielectric material 322 may be exposed to a chemical mechanical planarization (CMP) process to planarize the doped dielectric material 322 such that the exposed surface 324 of the doped dielectric material 322 is substantially coplanar with an upper surface of the sacrificial material 314. Exposing the doped dielectric material 322 to the CMP process may remove the overburden regions 326 (FIG. 3C) of the doped dielectric material 322. Accordingly, an insulative region 350 adjacent to the stair step structure 320 may comprise the doped dielectric material 322.

Figure 3E:
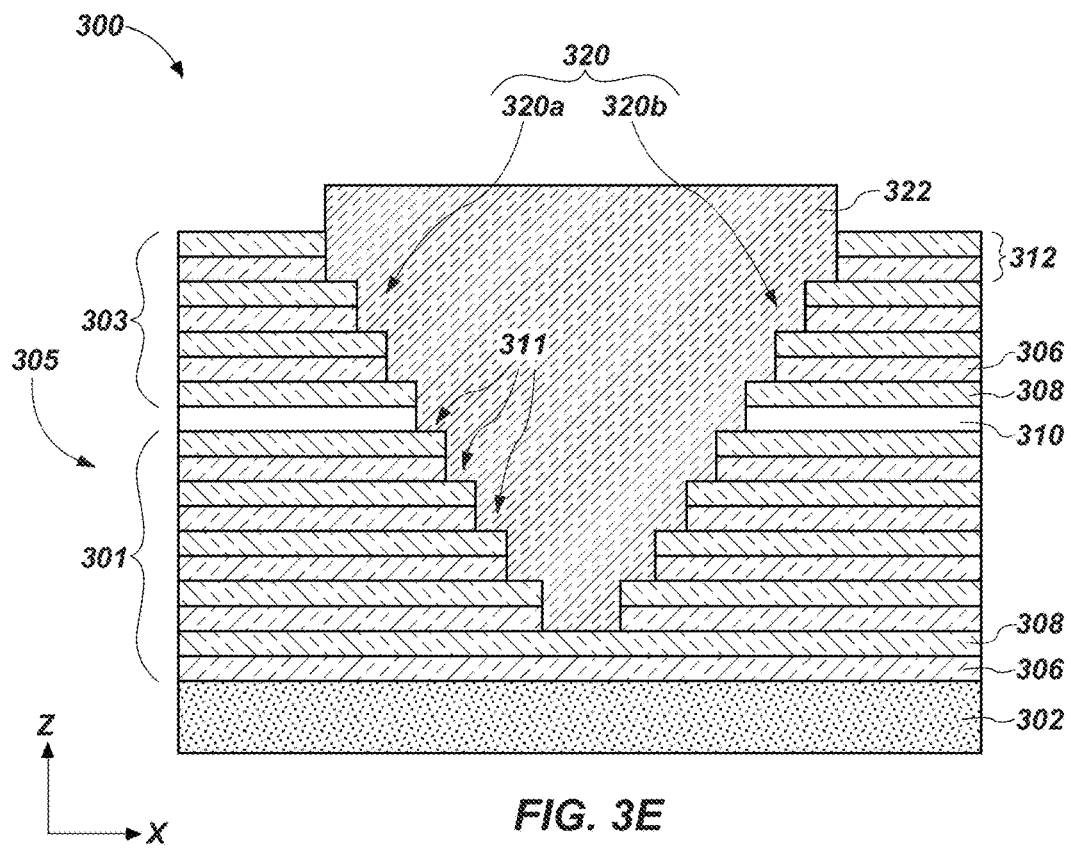

With reference to FIG. 3E, the sacrificial material 314 (FIG. 3D) may be removed to expose the uppermost tier 312. In some embodiments, the sacrificial material 314 is removed by exposing the sacrificial material 314 to, for example, a wet etchant such as one or more of nitric acid, hydrofluoric acid, potassium hydroxide, tetramethylammonium hydroxide (TMAH), and ethylene di-amine pyrocatechol (EDP). Although particular etchants have been described, the sacrificial material 314 may be removed with other etch chemistries. In some embodiments, removal of sacrificial material 314 may leave a portion of the doped dielectric material 322 extending above (e.g., farther from the source structure 302) than the uppermost tier 312.

Figure 3F:
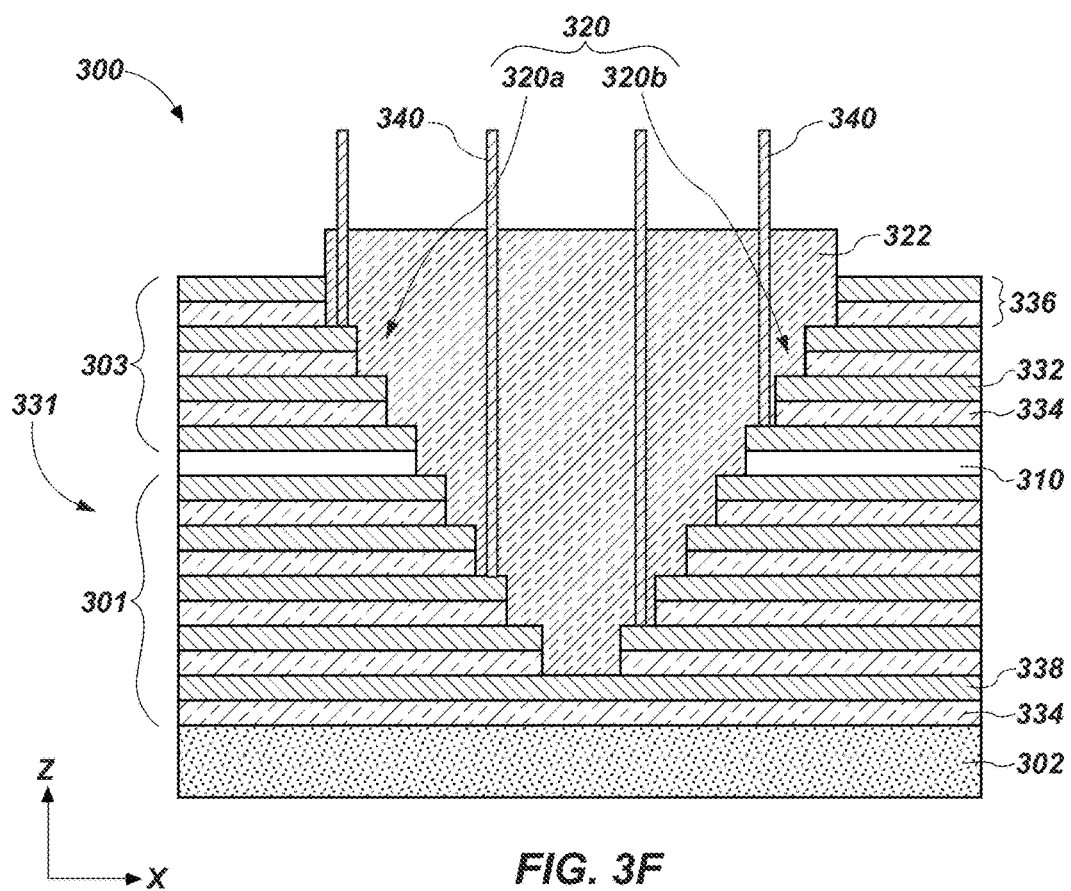

FIG. 3F illustrates the microelectronic device structure 300 after replacing the other insulative material 308 with an electrically conductive material to form electrically conductive structures 332 and form a conductive stack structure 331 including a vertically alternating arrangement of the electrically conductive structures 332 and electrically insulative structures 334 (formed from the insulative material 306 (FIG. 3E)) arranged in tiers 336 (corresponding to the tiers 312 (FIG. 3E)). For example slots may be formed to vertically extend through the stack structure 305 and then at least some of the other insulative material 308 (FIG. 3E) of the tiers 312 (FIG. 3E) may be selectively removed through the slots. By way of non-limiting example, the stack structure 305 may be exposed to one or more wet etchants including one or more of phosphoric acid, sulfuric acid, ammonium fluoride, or ammonium bifluoride to selectively remove the other insulative material 308. Thereafter, electrically conductive material may be deposited within open volumes formed through the extraction of the other insulative material 308 to form the electrically conductive structures 332 in a so-called "replacement gate" process. A lowermost of the other insulative materials 308 (e.g., the other insulative material 308 most proximate the source structure 302) may form a select gate structure 338, which may comprise a select gate source (SGS) structure.

The electrically conductive structures 332 may comprise access lines, which may also be referred to as word lines. The electrically conductive structures 332 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrOx), ruthenium oxide (RuOx), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive structures 332 and comprise tungsten.

After forming the electrically conductive structures 332, electrically conductive contact structures 340 (only some of which are illustrated in FIG. 3F, for clarity and ease of understanding embodiments of the disclosure) may be formed through the doped dielectric material 322 to individually contact the electrically conductive structures 332 of the conductive stack structure 331 and the steps 311 of the stadium structure 320. The electrically conductive contact structures 340 may comprise an electrically conducive material, such as one or more of the electrically conductive materials described above with reference to the electrically conductive structures 332. In some embodiments, the electrically conductive contact structures 340 comprise the same material composition as the electrically conducive structures 332.

Accordingly, a stadium structure (e.g., the stadium structure 320) may be formed with a doped dielectric material (e.g., the doped dielectric material 322) between the opposing stair step structures (e.g., the stair step structure 320a and the another stair step structure 320b) thereof. The doped dielectric material 322 may facilitate forming the stadium structure 320 to have a greater depth D (FIG. 3B) and a corresponding greater aspect ratio than conventional microelectronic devices including conventional dielectric materials (e.g., silicon dioxide, PSG, BPSG) between the opposing stair step structures and the stadium structure 320. The doped dielectric material 322 may exhibit a reduced tensile stress relative to conventional dielectric materials, such as thermally grown silicon dioxide, PSG, BSG, or BPSG. For example, conventional dielectric materials may exhibit a tensile stress responsive to exposure to temperature cycling (e.g., exposure to elevated temperatures followed by cooing) during further processing of the microelectronic device. Such tensile stress may cause non-axisymmetric changes in the wafer of the microelectronic device structure 300, leading to wafer bow and local stresses on adjacent structures. The local stresses on adjacent structures and the wafer bow may result in contact misalignment (e.g., misalignment between the electrically conductive contact structures 340 (FIG. 3F)) and the electrically conductive structures 332 (FIG. 3F). By way of contrast, the doped dielectric material 322 may exhibit a lower tensile stress while exhibiting less stress hysteresis than conventional dielectric materials.

The doped dielectric material 322 may be formulated and configured to exhibit less shrinkage responsive to exposure to thermal cycling compared to conventional dielectric materials. By way of comparison, conventional dielectric materials such as thermally formed silicon dioxide, BSG, PSG, BPSG, or other forms of silicon dioxide may shrink by as much as 0.60 volume percent to about 2.0 volume percent after exposure to thermal cycling. Since the volume of the insulative region 350 (FIG. 3D) adjacent to the stadium structure 320 (e.g., between the stair step structure 320a and the another stair step structure 320b) is large, the shrinkage may cause recessing of planarized surfaces (e.g., the exposed surface 324 (FIG. 3D) of the doped dielectric material 322 (FIG. 3D, FIG. 3E, FIG. 3F)). Recessed areas may become inaccessible to further polishing and may collect conductive materials, resulting in blocked contacts and electrical shorts (such as between electrically conductive contact structures 340 (FIG. 3F)). Further, the doped dielectric material 322 may comprise a hydrophobic surface (e.g., the exposed surface 324 (FIG. 3D) may be hydrophobic) and the doped dielectric material 322 may include less moisture than conventional dielectric materials. Accordingly, the doped dielectric material 322 may exhibit less moisture outgassing responsive to exposure to elevated temperatures compared to conventional dielectric materials. In addition, the doped dielectric material 322 may include fewer Si—OH bonds (e.g., may be substantially free of Si—OH bonds) than conventional dielectric materials. The doped dielectric material 322 may include a ratio of water to Si—O—Si bonds that is lower than a ratio of water to Si—O—Si bonds of conventional dielectric materials, such as BPSG.

Figure 4A:
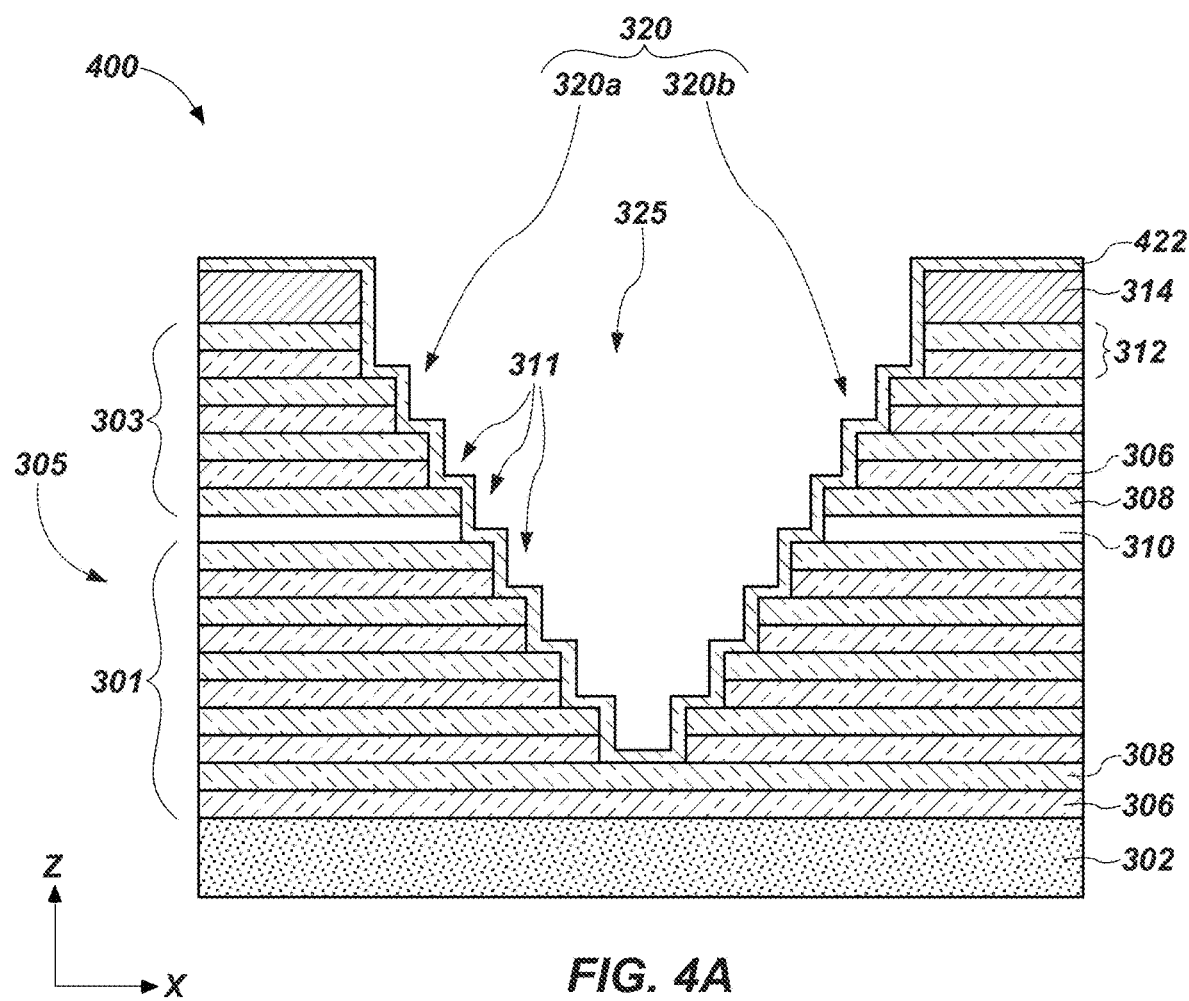
FIG. 4A through FIG. 4C illustrate a method of forming a microelectronic device structure including a doped dielectric material, in accordance with embodiments of the disclosure.
Figure 4B:
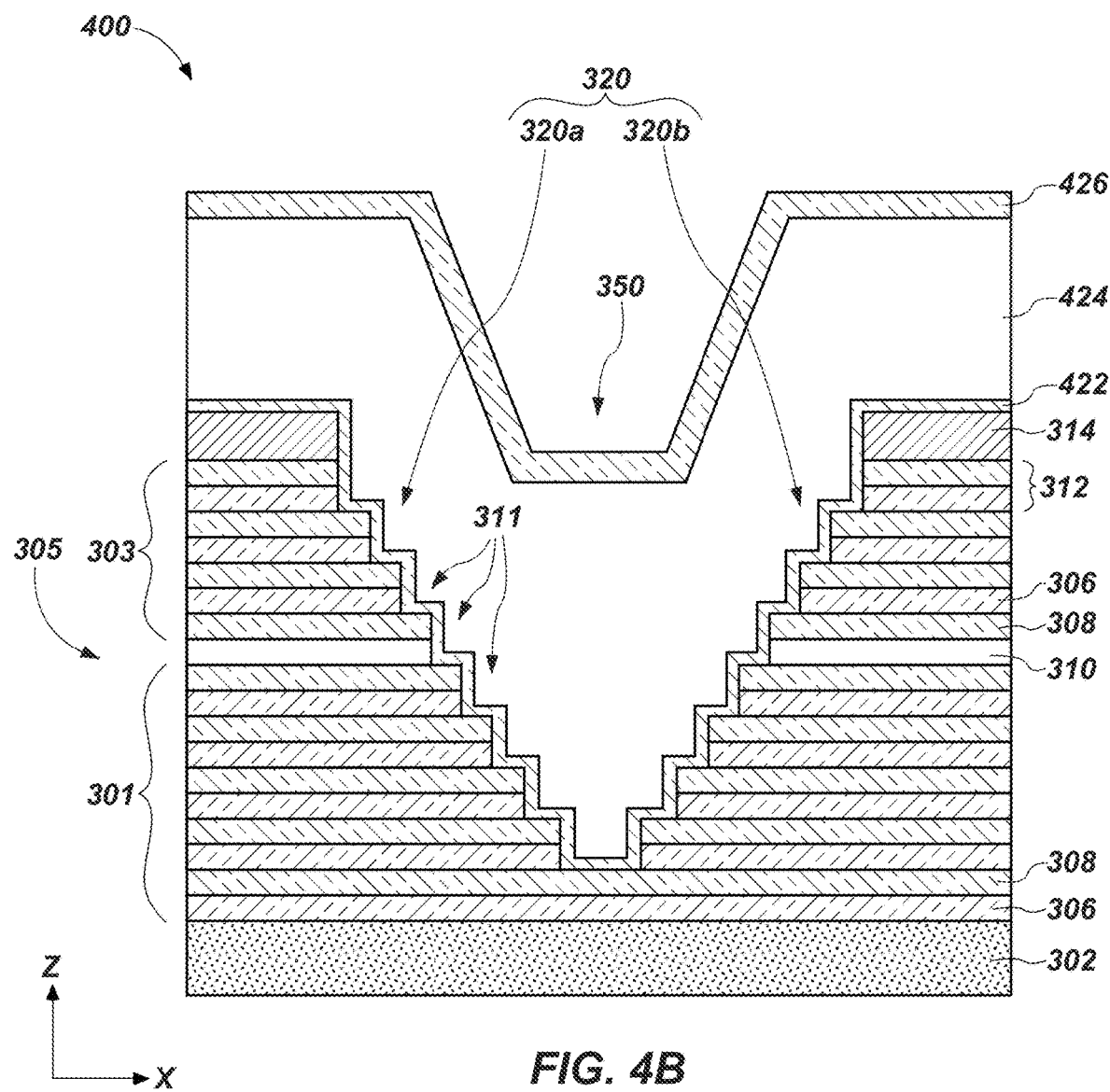
Figure 4C:
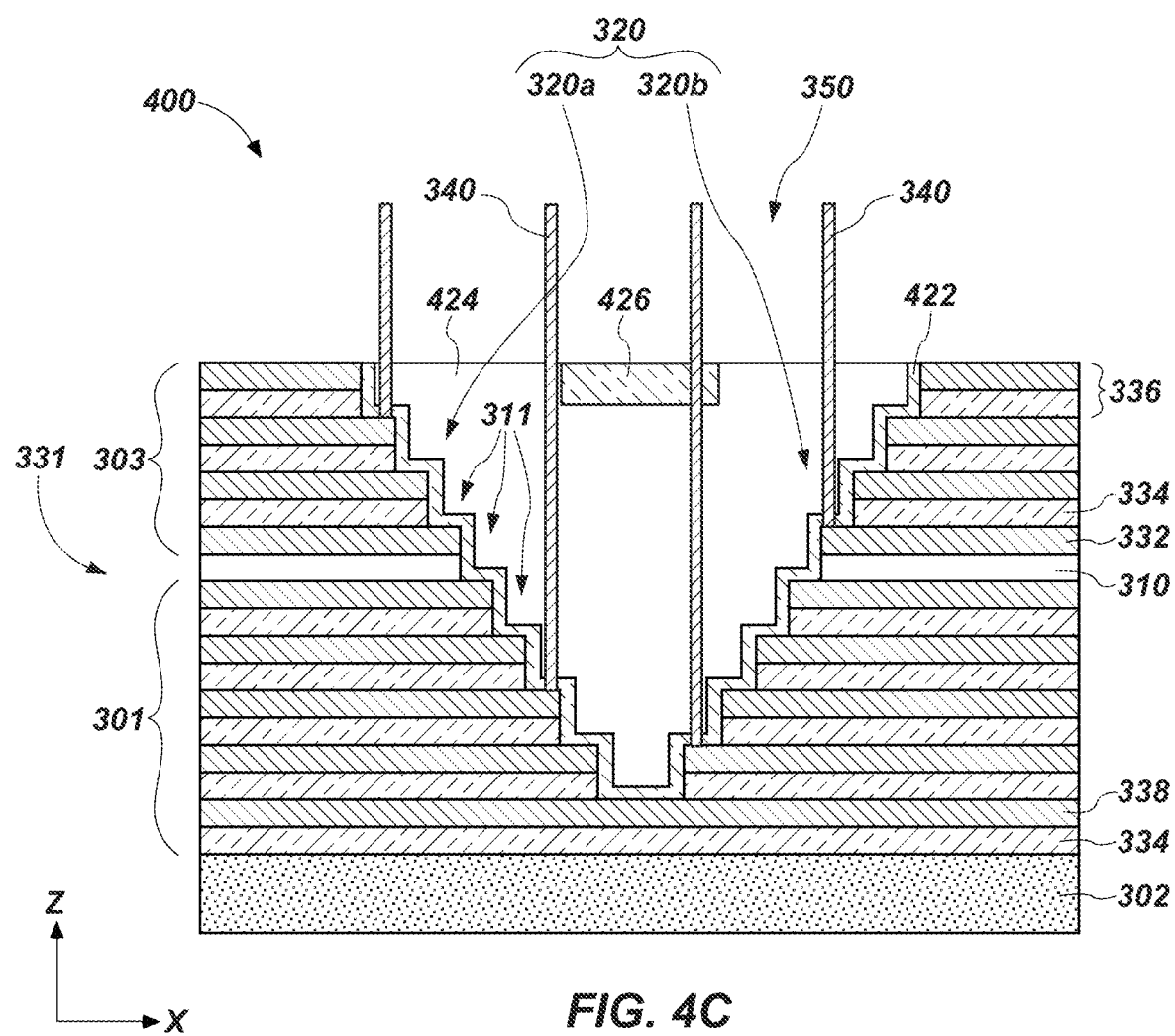

FIG. 4A through FIG. 4C illustrate a method of forming a microelectronic device structure 400 including a doped dielectric material, in accordance with embodiments of the disclosure. The microelectronic device structure 400 may be substantially similar to the microelectronic device structure 300 of FIG. 3B, except that a first dielectric material 422 may be formed in the valley 325 between the opposing steps 311. The first dielectric material 422 may be formed substantially conformally over the stack structure 305 and within the valley 325.

In some embodiments, the first dielectric material 422 comprises an undoped dielectric material, such as silicon dioxide formed by PECVD with a TEOS precursor, thermally grown silicon dioxide, or a silicate glass, such as an undoped silicate glass, BSP, PSG, or BPSG. In some embodiments, the first dielectric material 422 has a different material composition than the doped dielectric material 322 described above with reference to FIG. 3C.

With reference to FIG. 4B, a second dielectric material 424 may be formed over the first dielectric material 424. The second dielectric material 424 may comprise a doped dielectric material and may comprise one or more of the materials described above with reference to the doped dielectric material 322 (FIG. 3C). In some embodiments, the second dielectric material 424 comprises PECVD doped TEOS silicon dioxide doped with boron and phosphorus.

As described with reference to the doped dielectric material 322, a concentration of the one or more dopants in the second dielectric material 424 is substantially uniform throughout the second dielectric material 424. In other embodiments, the concentration of the one or more dopants in the second dielectric material 424 varies. For example, the concentration of the one or more dopants in the second dielectric material 424 may increase with an increasing distance from an interface between the first dielectric material 422 and the second dielectric material 424 to a maximum concentration proximate central portions of the second dielectric material 424.

With continued reference to FIG. 4B, a third dielectric material 426 may be formed over the second dielectric material 424. The third dielectric material 426 may comprise an undoped dielectric material, such as silicon dioxide formed by PECVD with a TEOS precursor, thermally grown silicon dioxide, or a silicate glass, such as an undoped silicate glass, BSG, PSG, or BPSG. In some embodiments, the third dielectric material 426 has a different material composition than the doped dielectric material 322 described above with reference to FIG. 3C. In some embodiments, the third dielectric material 426 has the same material composition as the first dielectric material 422. In other embodiments, the third dielectric material 426 has a different material composition than the first dielectric material 422.

With reference to FIG. 4C, after filling the valley 325 (FIG. 4A) with the first dielectric material 422, the second dielectric material 424, and the third dielectric material 426, the microelectronic device structure 400 may be exposed to a CMP process to planaraize the dielectric materials 422, 424, 426, as described above with reference to FIG. 3D. Thereafter, the sacrificial material 314 may be removed to expose an uppermost tier 312 of the stack structure 305, as described above with reference to FIG. 3E. After removing the sacrificial material 314, the other insulative materials 308 may be replaced with an electrically conductive material to form electrically conductive structures 332, as described above with reference to FIG. 3F. Thereafter, electrically conductive contact structures 340 may be formed through the first dielectric material 422, the second dielectric material 424, and the third dielectric material 426 to electrically connect with each of the electrically conductive structures 332, similar to formation of the electrically conductive contact structures 334 described above with reference to FIG. 3F.

Figure 4D:
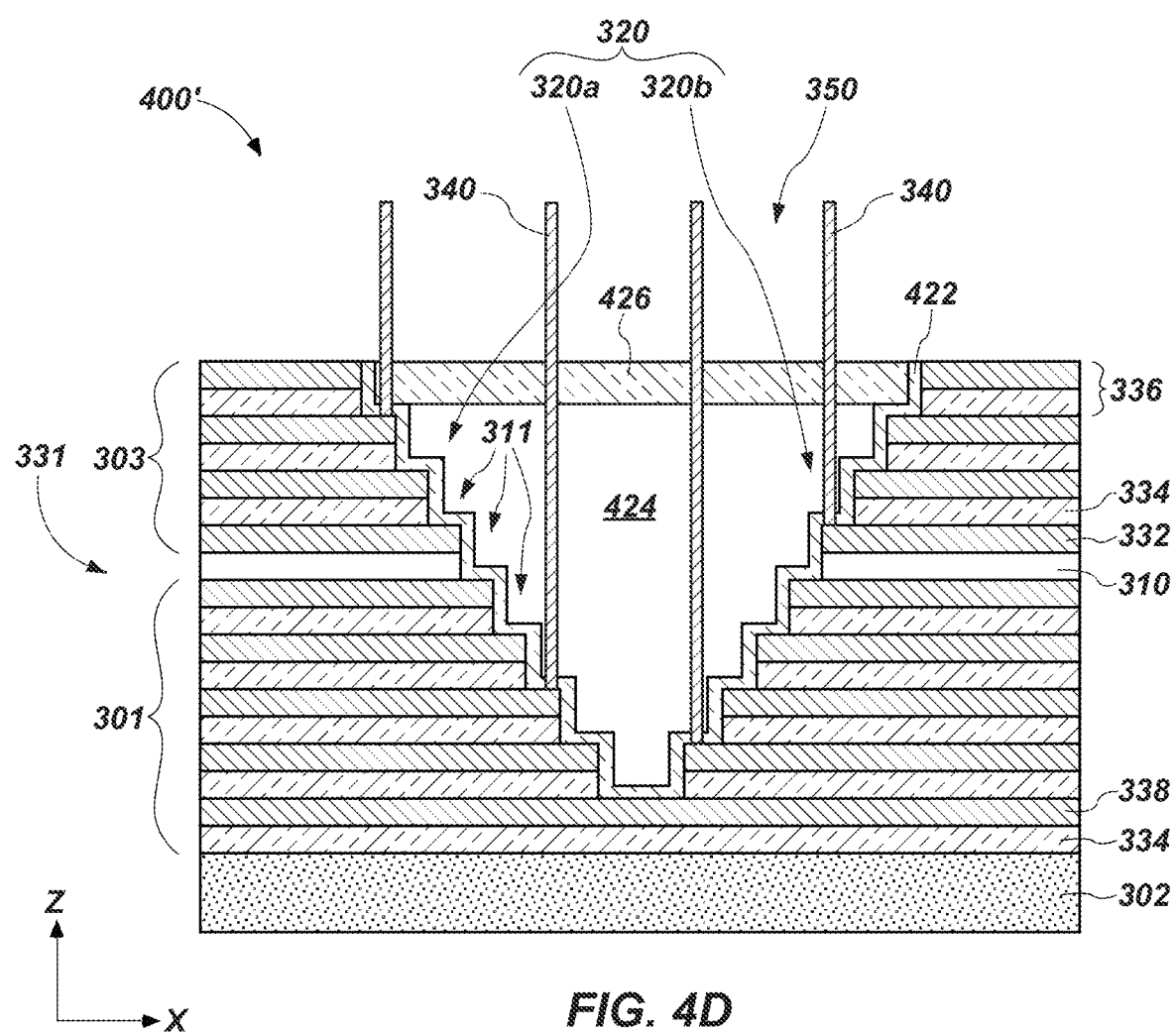
FIG. 4D is a simplified cross-sectional view of a microelectronic device structure, in accordance with embodiments of the disclosure.

Although FIG. 4C illustrates that the second dielectric material 424 includes exposed upper surfaces between the stair step structure 320a and the another stair step structure 320b (e.g., in the valley 325 (FIG. 3B)), the disclosure is not so limited. FIG. 4D illustrates another embodiment of a microelectronic device structure 400' in which the second dielectric material 424 is substantially surrounded on sides thereof by the first dielectric material 422 and the third dielectric material 426. The microelectronic device structure 400' may be formed by, for example, forming the second dielectric material 424 adjacent the first dielectric material 422 and forming the third dielectric material 426 adjacent to the second dielectric material 424, as described with reference to FIG. 4B. However, a lesser volume of the second dielectric material 424 may be formed. In other embodiments, after forming the second dielectric material 424, the microelectronic device structure 400' may be exposed to a CMP process to planarize the second dielectric material 424 and remove the overburden of the second dielectric material 424. Thereafter, the third dielectric material 426 may be formed over the second dielectric material 426.

Without being bound by any particular theory, it is believed that forming the first dielectric material 422 to comprise an undoped silicon dioxide material facilitates improved adhesion between the first dielectric material 422 and materials of the stack structure 305 (e.g., the insulative materials 306 and the other insulative materials 308) compared to forming a doped dielectric material (e.g., the second dielectric material 424) directly on the materials of the stack structure 305 at the stadium structure 320. In addition, the first dielectric material 422 may exhibit a reduced reactivity to various etchants, such as one or more of nitric acid, phosphoric acid, sulfuric acid, ammonium fluoride, or ammonium bifluoride, to which the microelectronic device structure 400, 400' may be exposed, such as during removal of the other insulative materials 308 through slots formed through the stack structure 305. In other words, the first dielectric material 422 may comprise an etch stop material that is not substantially removed by exposure to a wet nitride etch.

Forming the second dielectric material 424 including a doped dielectric material may facilitate formation of a large volume of an insulative region 350 (FIG. 4B) between stair step structures 320 that does not exhibit substantial shrinking, exhibits a low stress hysteresis, exhibits a compressive stress and a lower tensile stress than conventional dielectric materials, and is more easily removed by CMP processes relative to conventional undoped dielectric materials. In addition, forming the third dielectric material 426 over the second dielectric material 424 may facilitate improved adhesion of a mask material over the third dielectric material 426 compared to forming a mask material over a doped dielectric material. The mask material may be used during, for example, formation of the electrically conductive contact structures 340 in electrical communication with the electrically conductive structures 332.

Figure 5A:
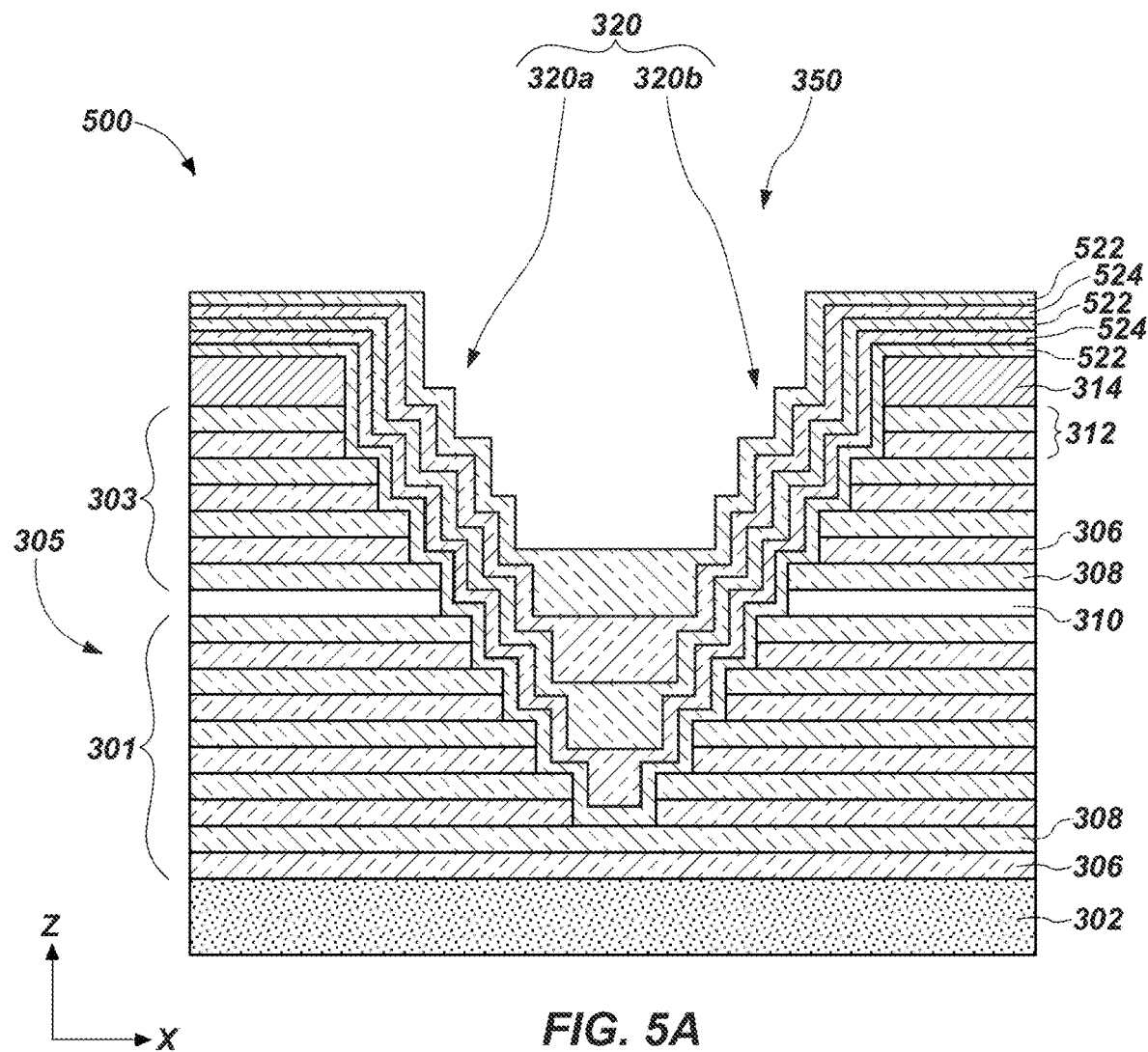
FIG. 5A through FIG. 5B illustrate a method of forming a microelectronic device structure comprising alternating dielectric materials between stair step structures, in accordance with embodiments of the disclosure.
Figure 5B:
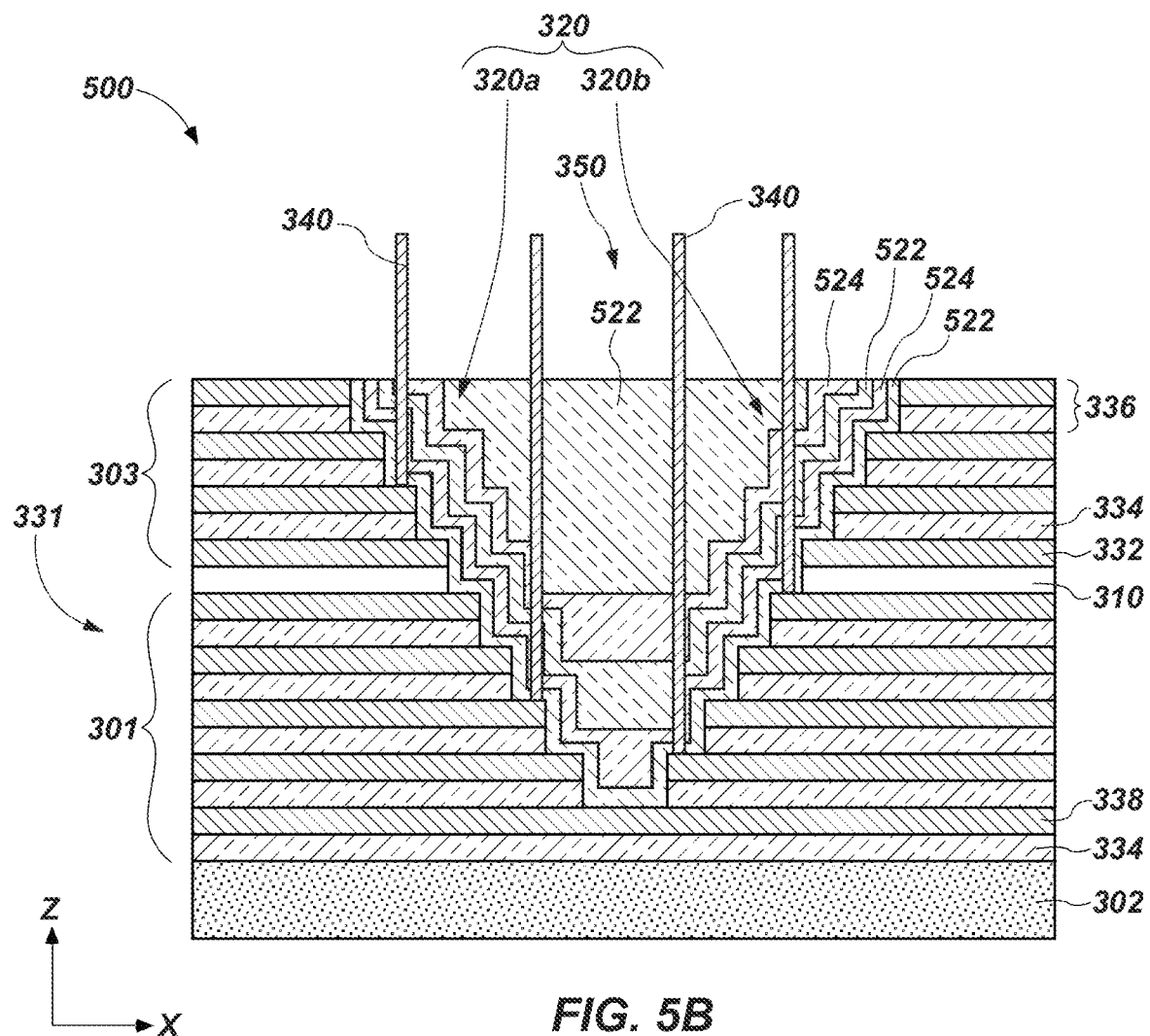

Although FIG. 4A through FIG. 4D have been described and illustrated as including only the first dielectric material 422, the second dielectric material 424, and the third dielectric material 426, the disclosure is not so limited. FIG. 5A through FIG. 5B illustrate a method of forming a microelectronic device structure 500 comprising alternating dielectric materials within the valley 325 (FIG. 4A) (e.g., between the stair step structure 320a and the another stair step structure 320b of the stadium structure 320).

With reference to FIG. 5A, the microelectronic device structure 500 may be formed in substantially the same manner as formation of the microelectronic device structure 300 described above with reference to FIG. 3B. After forming the stadium structure 320, an alternating sequence of undoped dielectric materials 522 and doped dielectric materials 524 may be formed over the stack structure 305 and within the valley 325 (FIG. 4A).

The undoped dielectric materials 522 may comprise, for example, silicon dioxide (e.g., thermally formed silicon dioxide, TEOS silicon dioxide). The undoped dielectric materials 522 may include one or more of the materials described above with reference to the first dielectric material 422 (FIG. 4A). In some embodiments, each of the undoped dielectric materials 522 have the same material composition. In other embodiments, at least one of the undoped dielectric materials 522 has a different material composition than at least one other of the undoped dielectric materials 522.

The doped dielectric materials 524 may comprise, for example, one or more of the materials described above with reference to the doped dielectric material 322 (FIG. 3C). In some embodiments, each of the doped dielectric materials 524 has the same material composition. In other embodiments, one or more of the doped dielectric materials 524 has a different material composition (e.g., a different weight percent of the one or more dopants) than at least one other of the doped dielectric materials 524.

In some embodiments, one of the undoped dielectric materials 522 directly overlies and contacts the steps 311 (FIG. 3B) of the stadium structure 320. In other words, an undoped dielectric material 522 may contact the alternating sequence of insulative materials 306 and other insulative materials 308 of the tiers 312 of the stack structure 305. In some embodiments, an uppermost one of the alternating sequence of undoped dielectric materials 522 and doped dielectric materials 524 comprises an undoped dielectric material 522. In some embodiments, one or more of the doped dielectric materials 524 are surrounded by (e.g., on all sides thereof) by one or more of the undoped dielectric materials 522.

With reference to FIG. 5B, after forming the alternating sequence of undoped dielectric materials 522 and doped dielectric materials 524, at least a portion of the alternating sequence of undoped dielectric materials 522 and doped dielectric materials 524 may be planarized to form a substantially planar upper surface, and thereafter the sacrificial material 314 may be removed, as described above with reference to FIG. 3E. Following removal of the sacrificial material 314, slots may be formed through the stack structure 305 and the other insulative materials 308 may be removed and replaced with electrically conductive structures 332, as described above with reference to FIG. 3E. Electrically conductive contact structures 340 may be formed through the alternating sequence of undoped dielectric materials 522 and doped dielectric materials 524 and electrically connected to the electrically conductive structures 332, as described above with reference to FIG. 3F.

Accordingly, the microelectronic device structure 500 may include a stadium structure 320 (including a stair step structure 320a and another stair step structure 320b) and an alternating sequence of undoped dielectric materials 522 and doped dielectric materials 524. A lowermost one and an uppermost one of the alternating sequence of undoped dielectric materials 522 and undoped dielectric materials 524 may comprise undoped dielectric materials 522.

Although FIG. 5A and FIG. 5B illustrate a particular number (three) of undoped dielectric materials 522 and a particular number (two) of doped dielectric materials 524, the disclosure is not so limited. In other embodiments, the alternating sequence of undoped dielectric materials 522 and doped dielectric materials 524 may include more than three, more than four, more than six, more than eight, more than ten, more than fifteen, or more than twenty of each of the undoped dielectric materials 522 and the doped dielectric materials 524.

Although FIG. 5A and FIG. 5B have been described and illustrated as including an undoped dielectric material 522 on surfaces of the alternating sequence of insulative materials 306 and other insulative materials 308, the disclosure is not so limited. In other embodiments, one of the doped dielectric materials 524 contacts surfaces of the alternating sequence of insulative materials 306 and other insulative materials 308. In addition, an uppermost one of the dielectric materials has been described and illustrated as comprising one of the undoped dielectric materials 522, but in other embodiments the uppermost dielectric material comprises a doped dielectric material 524.

The microelectronic devices structures 300, 400, 400', and 500 including the doped dielectric materials (e.g., the doped dielectric material 322, the doped dielectric material 424, the doped dielectric materials 524) of the disclosure may exhibit improved gap filling properties (e.g., may substantially fill an entire volume of gaps, valleys, trenches, spaces) and improved step coverage compared to conventional dielectric materials. For example, the one or more dopants of the doped dielectric materials may facilitate surface reactions during formation (e.g., deposition, such as by PECVD) of the doped dielectric materials, increasing the deposition rate and uniformity of the doped dielectric materials. The uniformity of the doped dielectric materials may facilitate use of such materials in high aspect ratio openings (e.g., openings with an aspect ratio greater than about 10:1, greater than about 20:1, greater than about 40:1, or even greater than about 60:1). In addition, the doped dielectric materials may exhibit relatively higher removal rates during CMP processes compared to conventional dielectric materials, facilitating the stability and process margin for CMP processes.

The doped dielectric materials may exhibit a compressive stress. In addition, the doped dielectric materials may exhibit a tensile stress hysteresis less than a tensile stress hysteresis of conventional dielectric materials responsive to exposure to elevated temperatures, which stress hysteresis may lead to contact misalignment. The doped dielectric materials may absorb and outgas less moisture than conventional dielectric materials, reducing the risk of device failure, such as by delamination of the doped dielectric materials from adjacent structures or materials. In addition, the doped dielectric material may exhibit less change in volume (e.g., shrinkage) responsive to exposure to elevated temperatures compared to conventional dielectric materials. Further, the dopants of the doped dielectric materials may be substantially stable and may not substantially redistribute within the doped dielectric material or to adjacent materials responsive to exposure to elevated temperatures. The doped dielectric materials may also exhibit comparable leakage current, moisture absorption, and surface roughness as conventional dielectric materials.

Accordingly, in some embodiments, a microelectronic device comprises a stack structure comprising alternating conductive structures and insulating structures arranged in tiers, each of the tiers individually comprising one of the conductive structures and one of the insulating structures, staircase structures within the stack structure and having steps comprising edges of the tiers, and a doped dielectric material adjacent the steps of the staircase structures and comprising silicon dioxide doped with one or more of boron, phosphorus, carbon, and fluorine, the doped dielectric material having a greater ratio of Si—O—Si bonds to water than borophosphosilicate glass.

Accordingly, in at least some embodiments, a method of forming a microelectronic device comprises forming a stair step structure in a stack structure comprising alternating first materials and second materials, forming, by plasma enhanced physical vapor deposition using tetraethyl orthosilicate and an oxygen source, a doped dielectric material comprising silicon dioxide doped with one or more of boron, phosphorus, fluorine, and carbon adjacent to the stair step structure, and planarizing the doped dielectric material.

Accordingly, in at least some embodiments, a microelectronic device comprises at least one stair step structure within a stack structure comprising tiers each individually comprising a conductive structure and an insulating structure vertically adjacent the conductive structure, the at least one stair step structure having steps comprising horizontal ends of the tiers, an undoped dielectric material physically contacting the steps of the at least one stair step structure, and a doped dielectric material comprising silicon dioxide doped with one or more of boron, phosphorus, fluorine, and carbon adjacent to the undoped dielectric material.

Figure 6:
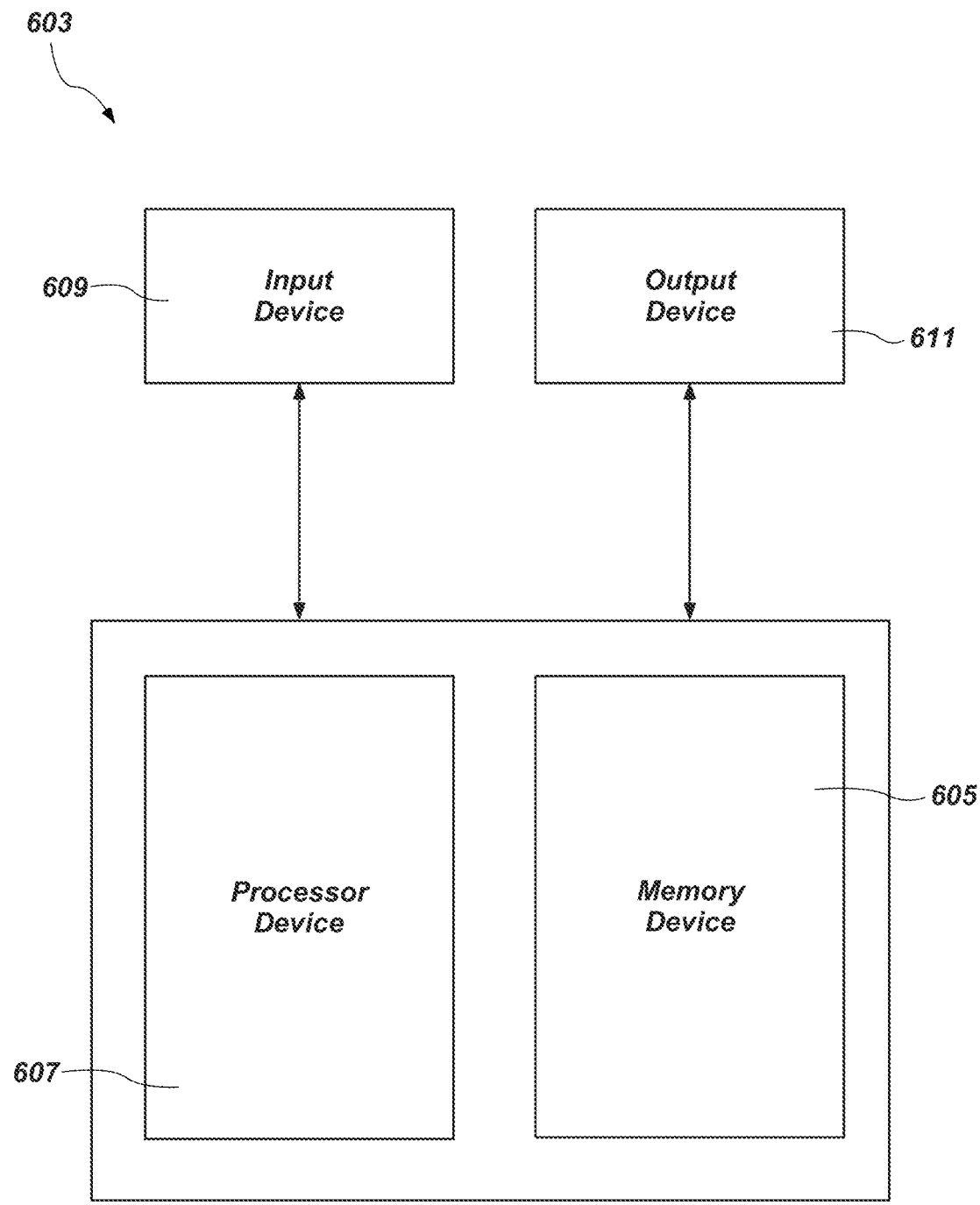
FIG. 6 is a block diagram of an illustrative electronic system, in accordance with embodiments of the disclosure.

Microelectronic devices (e.g., the microelectronic device 100) including microelectronic device structures (e.g., the microelectronic device structures 200, 300, 400, 400', 500) including stair step structures (e.g., the stair step structures 320a, 320b) in accordance with embodiments of the disclosure may be used in embodiments of electronic systems of the disclosure. For example, FIG. 6 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 603 includes at least one memory device 605. The memory device 605 may include, for example, an embodiment of a microelectronic device structure previously described herein (e.g., one of the microelectronic device structures 200, 300, 400, 400', 500 previously described with reference to FIG. 2, FIG. 3A through FIG. 3F, FIG. 4A through FIG. 4C, FIG. 4D, and FIG. 5A through FIG. 5B, respectively) including the stair step structures (e.g., the stair step structures 320a, 320b), and the insulative regions (e.g., the insulative regions 350) and the doped dielectric materials (e.g., the doped dielectric material 322, the doped dielectric material 424, and the doped dielectric materials 524).

The electronic system 603 may further include at least one electronic signal processor device 607 (often referred to as a "microprocessor"). The electronic signal processor device 607 may, optionally, include an embodiment of a microelectronic device structure previously described herein (e.g., one or more of the microelectronic device structures 200, 300, 400, 400', 500 previously described with reference to FIG. 2, FIG. 3A through FIG. 3F, FIG. 4A through FIG. 4C, FIG. 4D, and FIG. 5A through FIG. 5B, respectively). The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607.

Figure 7:
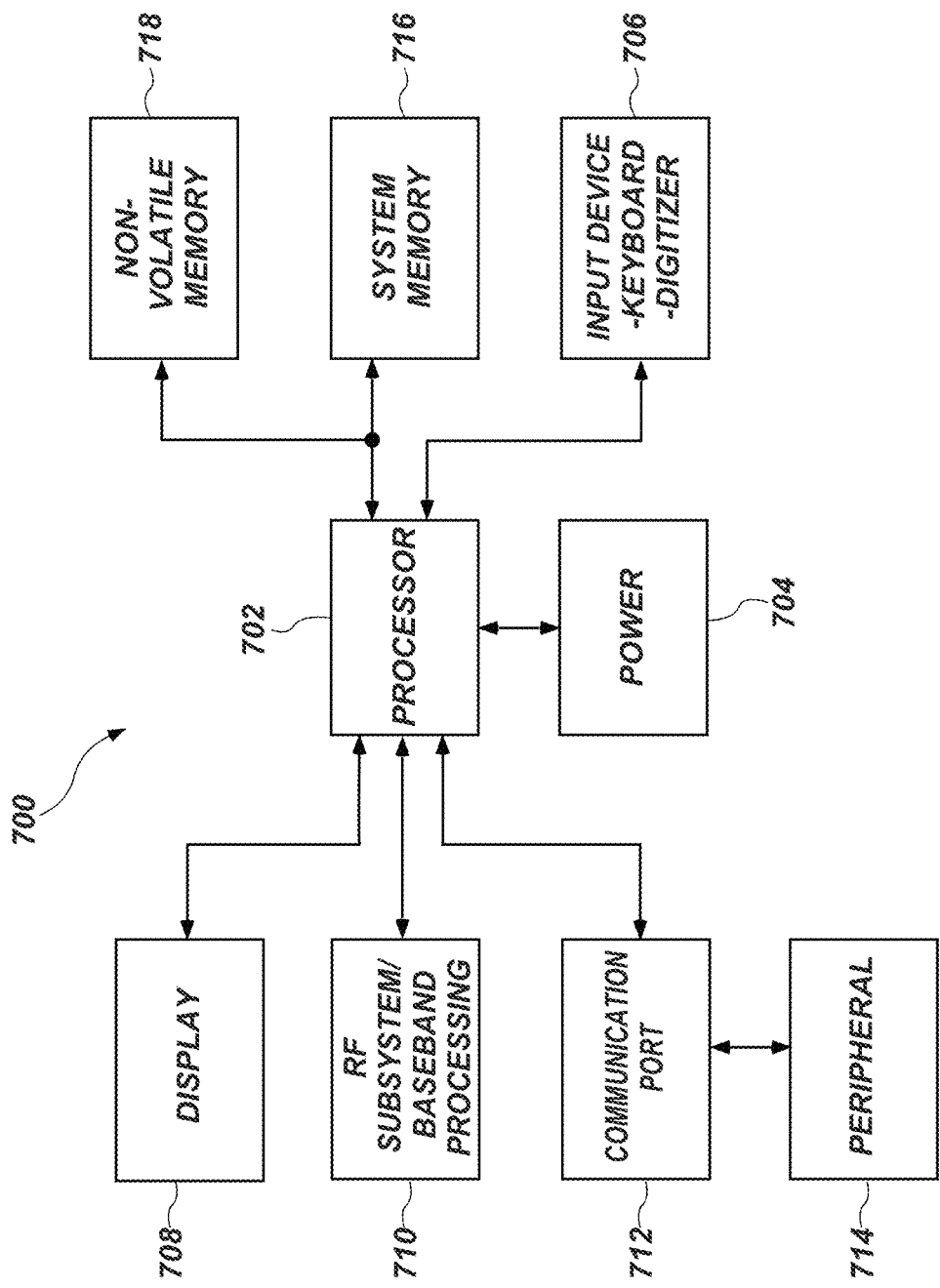
FIG. 7 is a processor-based system, in accordance with embodiments of the disclosure.

With reference to FIG. 7, depicted is a processor-based system 700. The processor-based system 700 may include various microelectronic devices (e.g., microelectronic devices including one or more of the microelectronic device structures 200, 300, 400, 400', 500) manufactured in accordance with embodiments of the present disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 and other subcomponents of the processor-based system 700 may include microelectronic devices (e.g., microelectronic devices including one or more of the microelectronic device structures 200, 300, 400, 400', 500) manufactured in accordance with embodiments of the present disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other devices may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include semiconductor devices, such as the microelectronic devices (e.g., the microelectronic devices structures 200, 300, 400, 400', 500) described above, or a combination thereof.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and flash memory to be used in conjunction with the system memory 716. The size of the non-volatile memory 718 is typically selected to be just large enough to store any necessary operating system, application programs, and fixed data. Additionally, the non-volatile memory 718 may include a high-capacity memory such as disk drive memory, such as a hybrid-drive including resistive memory or other types of non-volatile solid-state memory, for example. The non-volatile memory 718 may include microelectronic devices, such as the microelectronic devices (e.g., the microelectronic device structures 200, 300, 400, 400', 500) described above, or a combination thereof.

Accordingly, in some embodiments, an electronic device comprises an input device, an output device, and a processor device operably coupled to the input device and the output device, and a memory device operably coupled to the processor device. The memory device comprises a stack structure comprising alternating conductive structures and insulating structures arranged in tiers, a stadium structures within the stack structure and comprising opposing stair step structures each individually having steps comprising edges of the tiers, and a dielectric material disposed horizontally between the opposing stair step structures of the stadium structure and comprising silicon dioxide and one or more dopants selected from boron, phosphorus, carbon, and fluorine.

EXAMPLES

Example 1

A thermally grown silicon dioxide dielectric material was formed by conventional methods. A BPSG dielectric material was formed by conventional methods. A doped dielectric material comprising silicon dioxide doped with boron and phosphorus was formed by PECVD with TEOS (PECVD TEOS Sift). Various properties of the thermally grown silicon dioxide dielectric material, the BPSG dielectric material, and the doped dielectric material were compared, as shown in Table I below.

TABLE I

| | Conventional SiO$_2$ | BPSG | PECVD TEOS SiO$_2$ |
|---|---|---|---|
| Moisture outgassing | Base | 4x | 1x |
| Stress hysteresis on thermal cycling (MPa) | −260 | −90 | 10 |
| CMP rates (Å/s) | Base | 2.9x | 2.5x |
| Surface roughness | Base | 3.2x | 2.2x |
| Surface hydrophobicity | Base | 0.15x | 0.67x |
| Blanket etch rate | Base | 1.05x | 1.05x |
| Leakage current | Base | Same | Same |
| Deposition rate | Base | 1x | 1.35x |
| Film shrinkage | Base | 1.5-2% | 0% |
| Step coverage | Base | | 97.50% |

With reference to Table I, the doped dielectric material exhibited less moisture outgassing than the BPSG dielectric material. The doped dielectric material exhibiting a lower magnitude of stress hysteresis responsive to thermal cycling compared to the thermally grown silicon dioxide dielectric material and the BPSG dielectric material. The doped dielectric material exhibited a faster CMP rate, a faster blanket etch rate, better step coverage, and a lower surface hydrophobicity compared to the thermally grown silicon dioxide dielectric material. The doped dielectric material exhibited a faster deposition rate and less shrinkage (e.g., reduction in volume) than the thermally grown silicon dioxide dielectric material and the BPSG dielectric material.

Example 2

Figure 8:
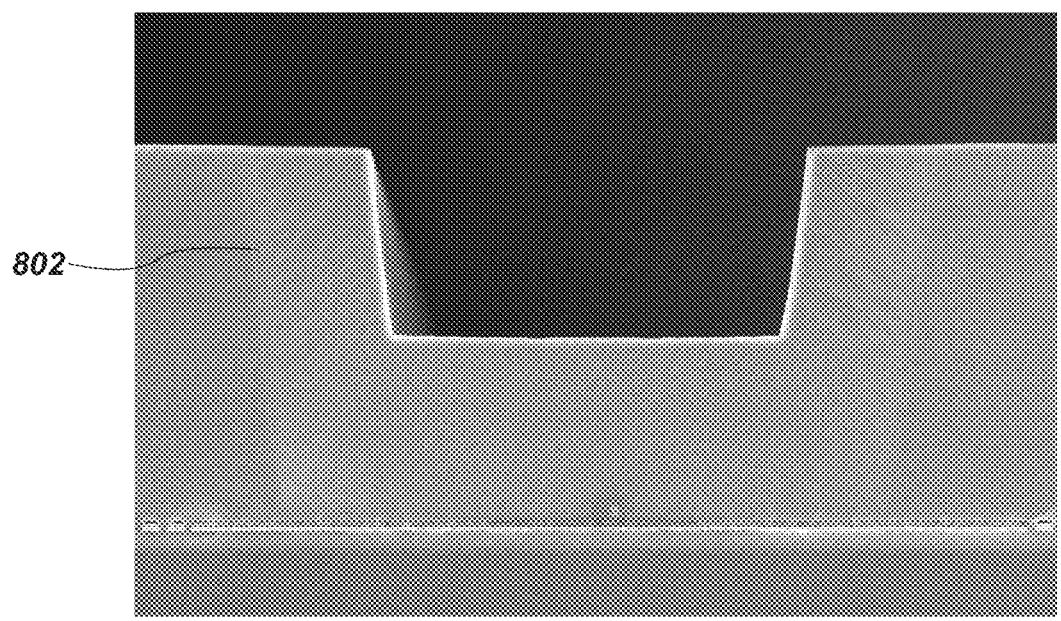
FIG. 8 is a SEM image of silicon dioxide formed by PECVD using tetraethyl orthosilicate and doped with boron and phosphorus.

PECVD TEOS was formed within an opening in a stack structure comprising a vertically alternating sequence of insulative materials and another insulative material. The PECVD TEOS was doped with boron and phosphorous. FIG. 8 is a SEM image illustrating the boron and phosphorus doped PECVD TEOS. As can be seen in the SEM image, the PECVD dielectric material exhibits a so-called "striation pattern" along sidewalls 802 of the PECVD TEOS (at an interface of the PECVD TEOS and the stack structure of the alternating sequence of insulative materials and another insulative material). The striation patterns extend at an angle within a range from about 30° to about 60° with respect to the interface between the PECVD TEOS and the stack structure. The striation pattern is characteristic of the PECVD TEOS on the sidewall.

Example 3

A doped dielectric material was formed by PECVD using TEOS and was doped with about 4.5 weight percent boron and about 2.5 weight percent phosphorus. A conventional silicate glass dielectric material comprising BPSG was also formed by conventional methods. Another conventional dielectric material was formed by thermal deposition of silicon dioxide (referred to herein as a thermally grown dielectric material).

The doped dielectric material and the conventional silicate glass dielectric material were exposed to annealing conditions at 700° C. for about 30 minutes. The doped dielectric material exhibited shrinkage of about 0.1 volume percent to about 0.2 volume percent. By way of contrast, the conventional BPSG dielectric material exhibited a reduction in volume of about 2.5 volume percent.

Figure 9A:
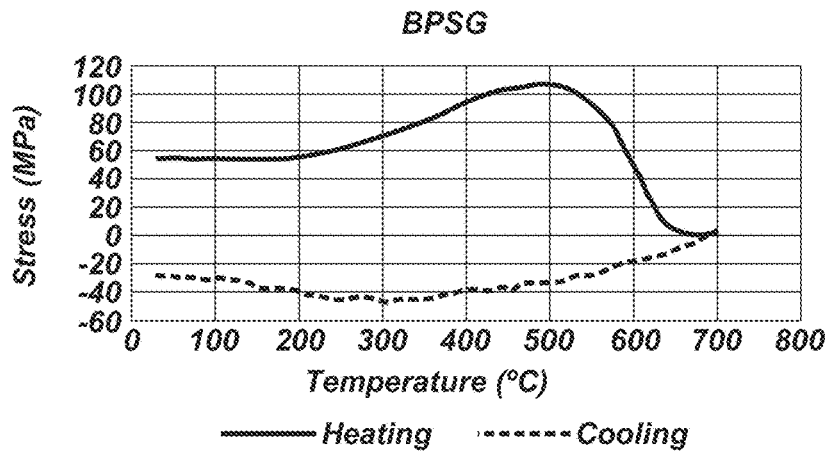
FIG. 9A, FIG. 9B, and FIG. 9C are graphs of the stress of a conventional BPSG dielectric material, a thermally grown dielectric material, and a doped dielectric material, respectively, as a function of temperature during temperature cycling.
Figure 9B:
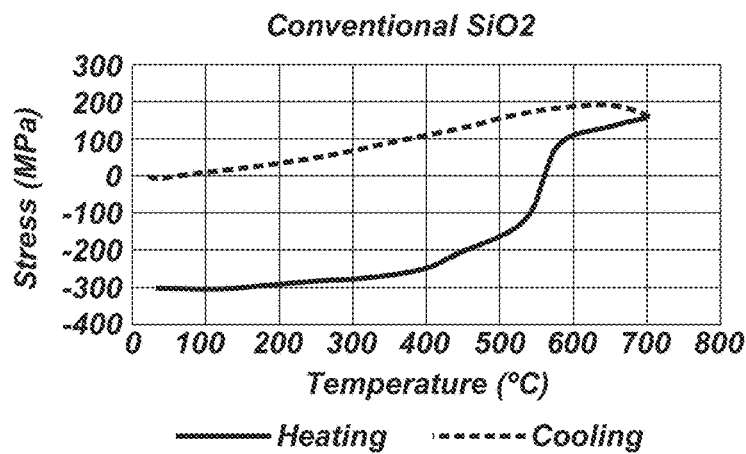
Figure 9C:
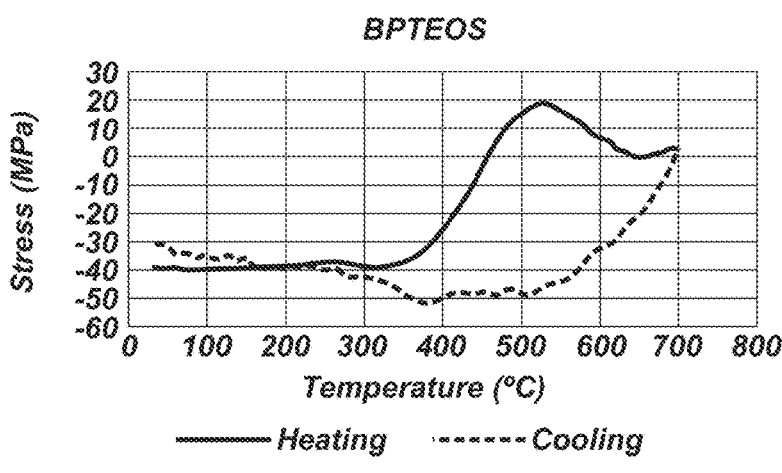

Each of the doped dielectric material, the BPSG dielectric material, and the thermally grown dielectric material were exposed to a temperature ramp from about 20° C. to about 700° C. and were allowed to cool back to about 20° C. The tensile stress of each material was measured while ramping the temperature to about 700° C. and during cool down of the material back to about 20° C. FIG. 9A, FIG. 9B, and FIG. 9C are graphs of the stress of the conventional BPSG dielectric material, the thermally grown dielectric material, and the doped dielectric material, respectively, as a function of temperature during heating and during cool down. With reference to FIG. 9A and FIG. 9B, the conventional BPSG dielectric material and the thermally grown dielectric material exhibited stress hysteresis responsive to exposure to the elevated temperature after cooldown. For example, with reference to FIG. 9A, the magnitude of the stress of the conventional BPSG dielectric material increased during the temperature ramp then decreased to about 0 MPa at about 700° C. During cool down, the magnitude of the stress of the conventional BPSG dielectric material increased and exhibited a hysteresis stress of about 58 MPa after returning to about 20° C. With reference to FIG. 9B, the thermally grown dielectric material exhibited an increase in tensile stress during the temperature ramp up to about 700° C. and decreased down to about −300 MPa when returned to about 20° C. Accordingly, the thermally grown dielectric material exhibited a residual hysteresis stress when returned to room temperature. By way of contrast, and with reference to FIG. 9C, the doped dielectric material exhibited a change in stress when heated to about 700° C. and the stress reduced to about −40 MPa when cooled to about room temperature. Accordingly, the doped dielectric material exhibited a residual stress of lower magnitude relative to the conventional BPSG dielectric material and the thermally grown dielectric material. Stated another way, upon cooling, the doped dielectric material exhibited a residual stress that was closer to its pre-heating stress state relative to the BPSG and the conventional Sift.

Example 4

Figure 10:
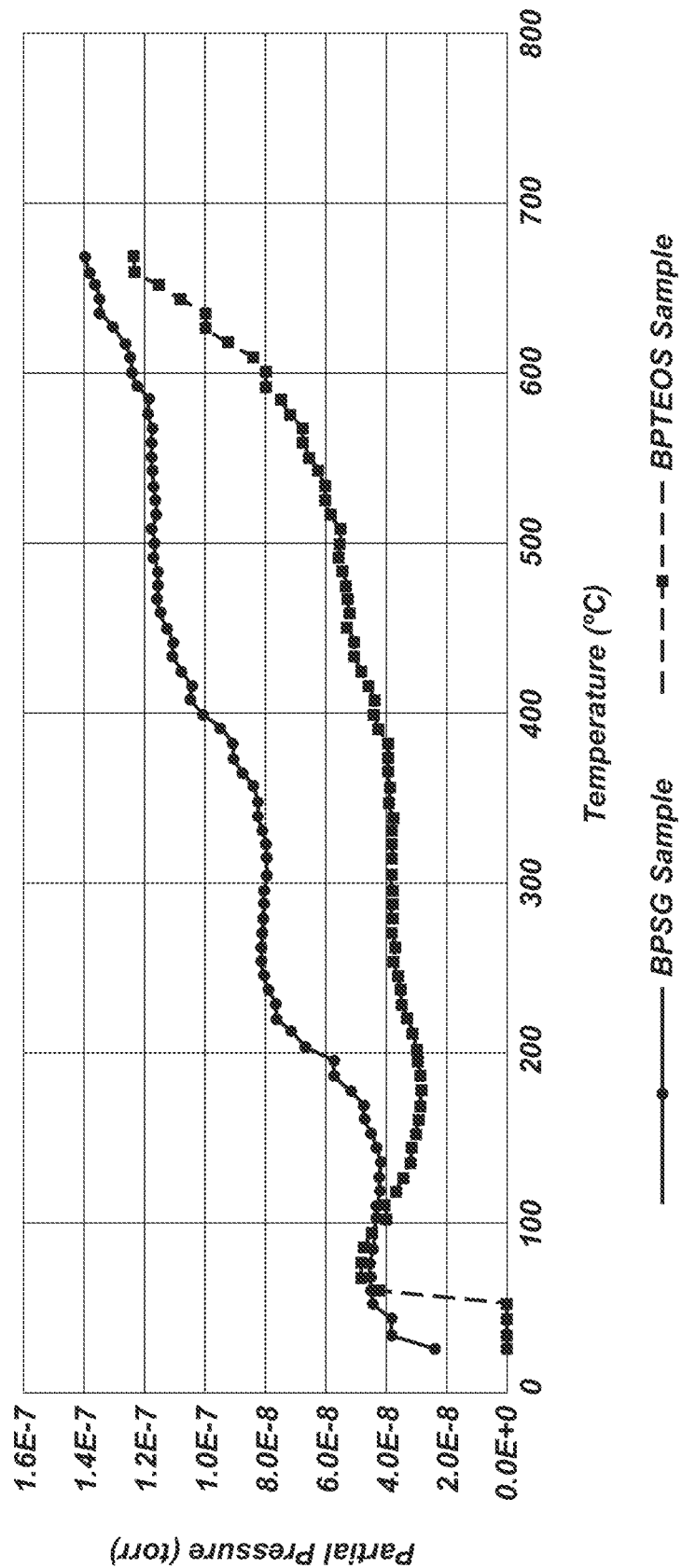
FIG. 10 is a graph illustrating a partial pressure of water as a function of temperature in a chamber containing a conventional BPSG dielectric material and the partial pressure of water as a function of temperature in another chamber containing a doped dielectric material formed according to embodiments of the disclosure.

Moisture outgassing of the doped dielectric material and the conventional BPSG dielectric material described above with reference to Example 3 was compared. FIG. 10 is a graph illustrating a partial pressure of water as a function of temperature in a chamber containing a conventional BPSG dielectric material and the partial pressure of water as a function of temperature in another chamber containing the doped dielectric material described above with reference to Example 2. The partial pressure of water is indicative of water (moisture) outgassing from the respective dielectric materials responsive to exposure to the elevated temperatures. In the temperature range from about 20° C. to about 670° C., the partial pressure of water in the chamber including the conventional BPSG was greater than the partial pressure of water in the chamber including the doped dielectric material at each temperature. Accordingly, the doped dielectric material may include less moisture than the conventional BPSG dielectric material and may be less prone to outgassing of moisture, which outgassing results in delamination of the dielectric materials from adjacent materials and poor adhesion of the dielectric materials to adjacent materials.

Example 5

Figure 11:
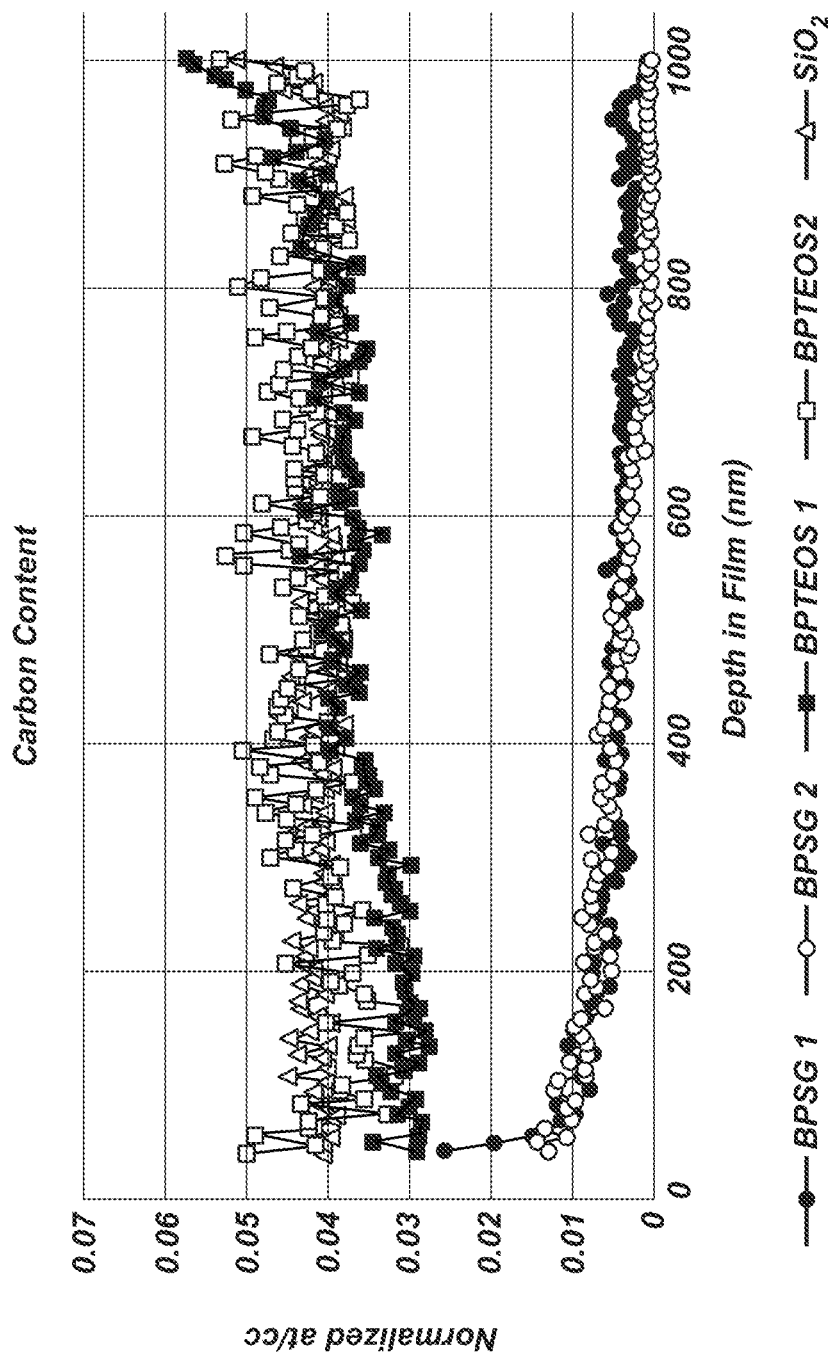
FIG. 11 through FIG. 13 are graphs illustrating the carbon content, the hydrogen content, and the nitrogen content of the various dielectric materials as a function of depth, in accordance with embodiments of the disclosure.
Figure 12:
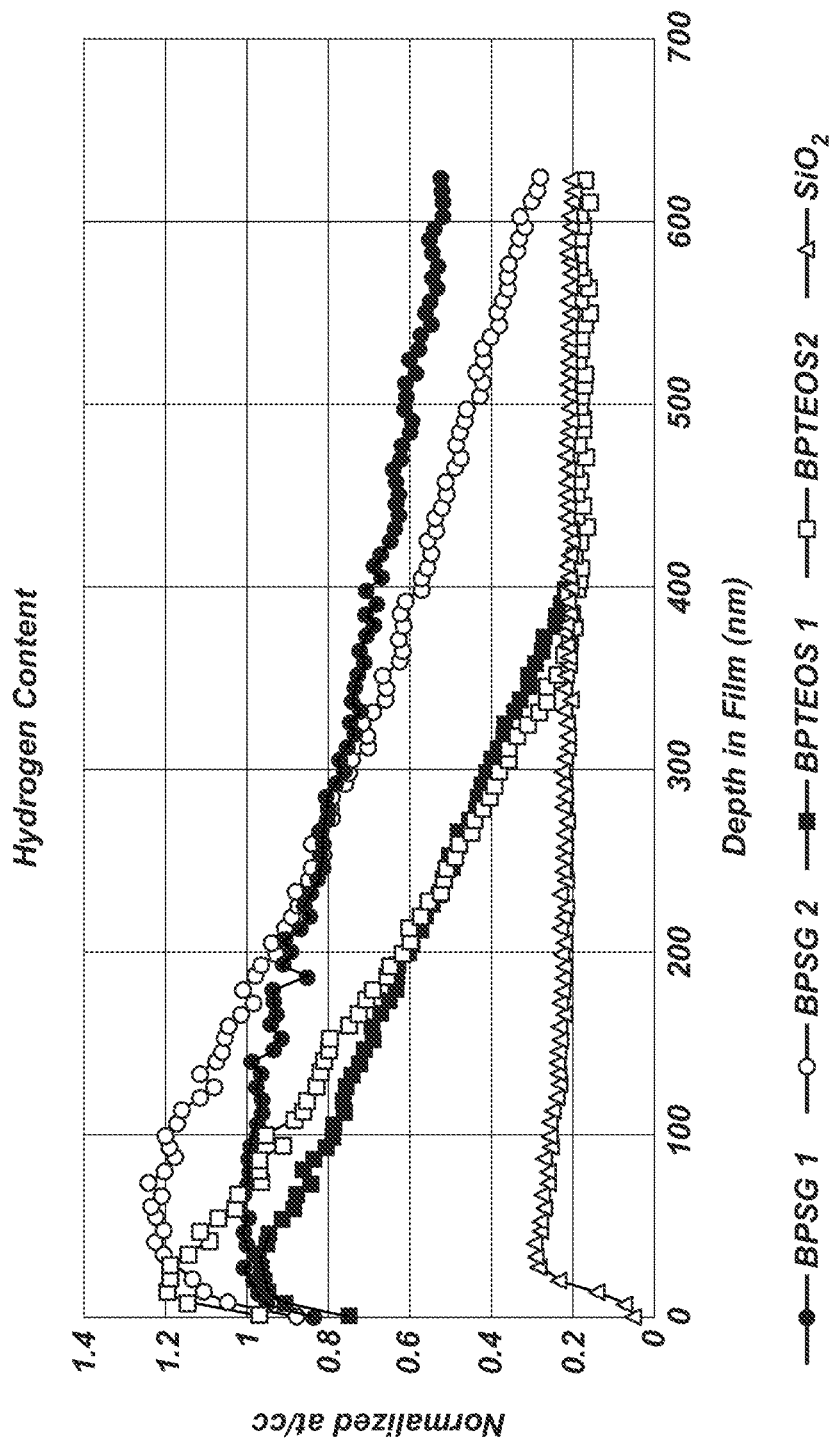
Figure 13:
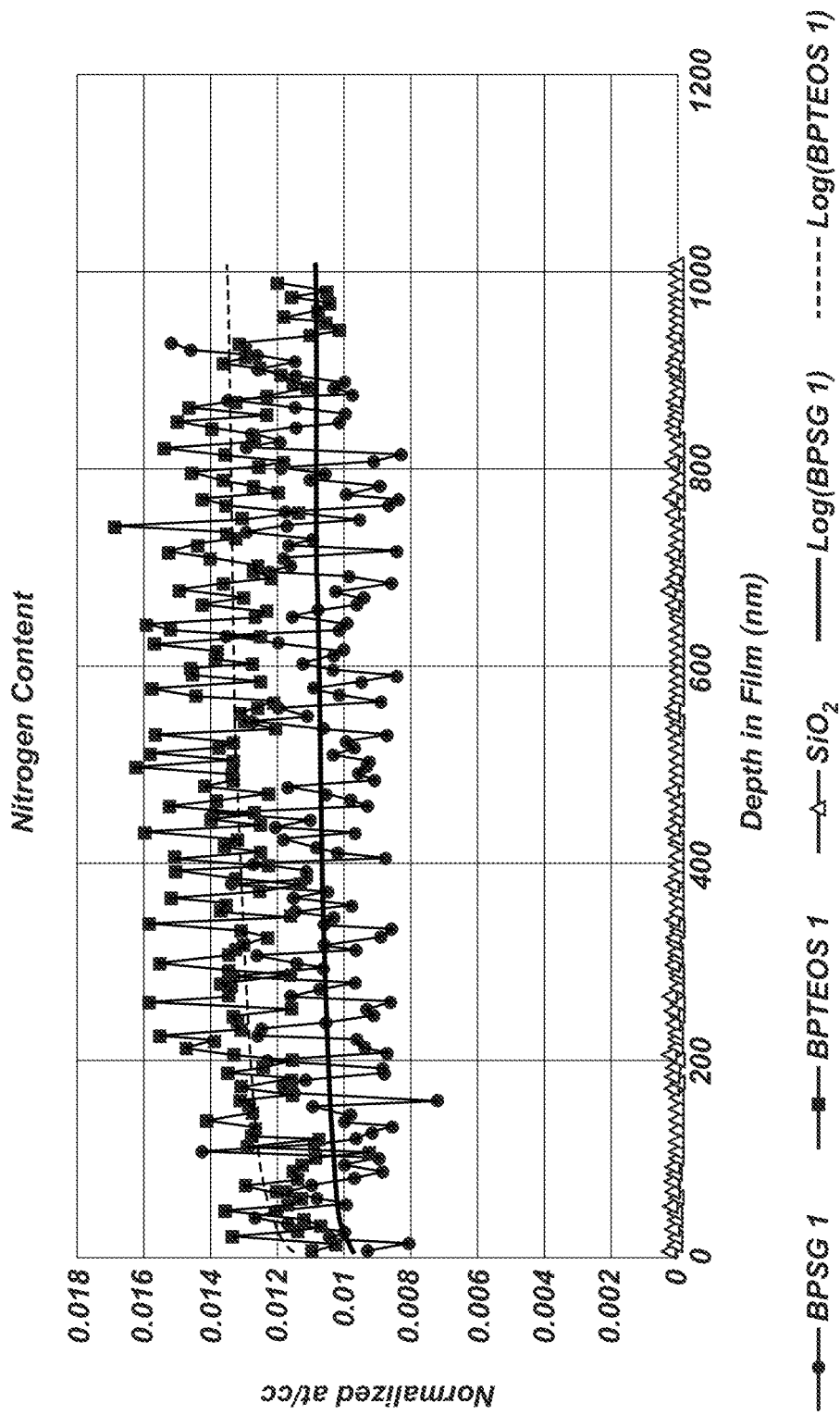

As in Example 1, a thermally grown silicon dioxide dielectric material ("conventional Sift") was formed by conventional methods. A first and second BPSG dielectric material were formed by conventional methods. A first and second doped dielectric material ("BPTEOS") comprising silicon dioxide doped with boron and phosphorus were formed by PECVD with TEOS. FIG. 11 through FIG. 13 are graphs illustrating the carbon content, the hydrogen content, and the nitrogen content, respectively, of the various materials as a function of depth. FIG. 11 is a graph illustrating the carbon content of conventional SiO$_2$, the BPSG, and the BPTEOS as a function of depth from an exposed surface, as obtained using secondary ion mass spectroscopy (SIMS). BPSG 1 is a BPSG dielectric material including about 4.5 atomic percent boron and about 3 atomic percent phosphorus. BPSG 2 is a BPSG dielectric material including about 5.9 atomic percent boron and about 3.6 atomic percent phosphorus. BPTEOS 1 is a BPTEOS material including about 4.5 atomic percent boron and about 3 atomic percent phosphorus and BPTEOS 2 is a BPTEOS material including about 5.9 atomic percent boron and about 3.6 atomic percent phosphorus.

As illustrated in FIG. 11, the BPTEOS 1 and BPTEOS 2 materials exhibited a greater amount of carbon throughout the film thickness compared to BPSG 1 and BPSG 2. FIG. 12 is a graph illustrating the hydrogen content of the dielectric materials as a function of depth in the respective dielectric films, as obtained using SIMS. As illustrated in FIG. 12, the hydrogen content of the BPSG 1 and BPSG 2 was higher than the hydrogen content of the BPTEOS 1 and BPTEOS 2 in the first about 600 nm of the film. With reference to FIG. 13, the BPTEOS 1 including a greater amount of nitrogen at depths up to at least about 1,000 nm compared to the conventional $SiO_2$ and BPSG 1.

Table II includes FTIR data of the conventional $SiO_2$, the BPSG 2 material, and the BPTEOS 2 material.

TABLE II

| | FTIR Peak Area | | | | | | |
|---|---|---|---|---|---|---|---|
| Sample | Si—OH | HOH (absorbed water) | B—O | P=O | Total Si—O—Si | Si—O—B | unknown |
| 1 µm BPSG 2 | NA | 9.31 | 8.58 | 6.63 | 36.5 | 6.2 | 5.85 |
| 1 µm BPTEOS 2 | NA | 8.59 | 8.14 | 4.11 | 39.8 | 5.33 | 5.81 |
| 1 µm $SiO_2$ | 0.787 | 1.77 | NA | NA | 48.5 | NA | NA |

With reference to Table II, the BPTEOS 2 material exhibited a lower FTIR peak for water than the BPSG 2 material, indicating that the BPTEOS 2 material had less water than the BPSG 2 material. The BPTEOS 2 material exhibited a lower ratio of the FTIR peak for water to the FTIR peak of Si—O—Si than the BPSG 2 material. In other words, the BPTEOS 2 material exhibited a greater ratio of Si—O—Si bonds to water than the BPSG 2 material.

Table III below includes the wavelength of the peaks of Table II measured using FTIR.

TABLE III

| | FTIR Peak Locations (cm$^{-1}$) | | | | | | | |
|---|---|---|---|---|---|---|---|---|
| Sample | Si—OH | HOH (absorbed water) | B—O | P=O | asymmetric Si—O—Si | Symmetric Si—O—Si | Si—O—B | unknown |
| 1 µm BPSG 2 | NA | 3375 | 1388 | 1332 | 1123 | 1058 | 918 | 672 |
| 1 µm BPTEOS 2 | NA | 3375 | 1389 | 1333 | 1111 | 1051 | 919 | 677 |
| 1 µm $SiO_2$ | 3660 | 3375 | NA | NA | 1133 | 1036 | NA | NA |

With reference to Table II and Table III, the BPTEOS 2 absorbed less water than the BPSG 2.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising alternating conductive structures and insulating structures arranged in tiers, each of the tiers individually comprising one of the conductive structures and one of the insulating structures;
   staircase structures within the stack structure and having steps comprising edges of the tiers;
   an undoped dielectric material contacting the steps of the staircase structures;
   a doped dielectric material contacting the undoped dielectric material and comprising silicon dioxide doped with one or more of boron, phosphorus, carbon, and fluorine, the doped dielectric material having a greater ratio of Si—O—Si bonds to water than borophosphosilicate glass; and
   an additional undoped dielectric material contacting the doped dielectric material, the doped dielectric material vertically intervening between at least a portion of the undoped dielectric material and at least a portion of the additional undoped dielectric material and horizontally intervening between at least an additional portion of the undoped dielectric material and at least an additional portion of the additional undoped dielectric material, the at least an additional portion of the undoped dielectric material vertically aligned with the at least an additional portion of the additional undoped dielectric material.

2. The microelectronic device of claim 1, wherein the doped dielectric material is doped with boron and phosphorus.

3. The microelectronic device of claim 1, wherein the one or more dopants constitute from about 1.0 weight percent to about 8.0 weight percent of the doped dielectric material.

4. The microelectronic device of claim 1, wherein the undoped dielectric material conformally overlies the steps.

5. The microelectronic device of claim 4, wherein the undoped dielectric material comprises undoped silicon dioxide.

6. The microelectronic device of claim 1, wherein the doped dielectric material comprises a greater carbon content than borophosphosilicate glass.

7. The microelectronic device of claim 1, wherein the staircase structures comprise one or more stadium structures, each stadium structure comprising opposing stair step structures.

8. The microelectronic device of claim 1, wherein a concentration of the one or more dopants is greater proximate central portions of the doped dielectric material than at other portions of the dielectric material.

9. The microelectronic device of claim 1, wherein the one or more dopants are uniformly distributed throughout the doped dielectric material.

10. The microelectronic device of claim 1, wherein the doped dielectric material has a density within a range from about 2.10 g/cm$^3$ to about 2.16 g/cm$^3$.

11. The microelectronic device of claim 1, further comprising electrically conductive contact structures extending through the doped dielectric material and in electrical communication with the conductive structures of the tiers.

12. The microelectronic device of claim 1, wherein the undoped dielectric material is between the doped dielectric material and the steps.

13. The microelectronic device of claim 1, wherein the doped dielectric material comprises carbon.

14. The microelectronic device of claim 1, wherein the doped dielectric material is doped with carbon and fluorine and comprises:
from about 0.1 weight percent to about 4.0 weight percent fluorine; and
from about 0.1 weight percent to about 4.0 weight percent carbon.

15. The microelectronic device of claim 1, wherein interfaces of the doped dielectric material interfacing with the steps of the undoped dielectric material comprise about 0 weight percent of the one or more of boron, phosphorus, carbon, and fluorine.

16. The microelectronic device of claim 1, wherein the undoped dielectric material comprises a different material composition than the additional undoped dielectric material.

17. A method of forming a microelectronic device, the method comprising:
forming a staircase structures comprising steps in a stack structure comprising tiers of alternating first materials and second materials;
forming an undoped dielectric material contacting the steps of the staircase structures;
forming, by plasma enhanced physical vapor deposition using tetraethyl orthosilicate and an oxygen source, a doped dielectric material comprising silicon dioxide doped with one or more of boron, phosphorus, fluorine, and carbon adjacent to the steps of the staircase structures, the doped dielectric material having a greater ratio of Si-O-Si bonds to water than borophosphosilicate glass, the doped dielectric material contacting the undoped dielectric material;
forming an additional undoped dielectric material contacting the doped dielectric material, the doped dielectric material vertically intervening between at least a portion of the undoped dielectric material and at least a portion of the additional undoped dielectric material and horizontally intervening between at least an additional portion of the undoped dielectric material and at least an additional portion of the additional undoped dielectric material, the at least an additional portion of the undoped dielectric material vertically aligned with the at least an additional portion of the additional undoped dielectric material;
planarizing the undoped dielectric material, the doped dielectric material, and the additional undoped dielectric material; and
replacing the second materials with conductive structures to form a stack structure comprising alternating conductive structures and insulating structures arranged in tiers, each of the tiers individually comprising one of the conductive structures and one of the insulating structures, the steps of the staircase structures comprising edges of the tiers.

18. The method of claim 17, wherein forming, by plasma enhanced physical vapor deposition using tetraethyl orthosilicate and an oxygen source, a doped dielectric material comprises forming the doped dielectric material including a boron precursor comprising one or more of triethylborane, triethyelborate, trimethylborate, cyanoborane, diborane, and decaborane.

19. The method of claim 17, wherein forming, by plasma enhanced physical vapor deposition using tetraethyl orthosilicate and an oxygen source, a doped dielectric material comprises forming the doped dielectric material including a phosphorus precursor comprising one or more of triethyl phosphate, trimethyl phosphate, phosphine, and trimethylphosphite.

20. The method of claim 17, wherein forming, by plasma enhanced physical vapor deposition using tetraethyl orthosilicate and an oxygen source, a doped dielectric material comprises forming a doped dielectric material comprising from about 1.0 weight percent to about 8.0 weight percent of the one or more dopants.

21. The method of claim 17, further comprising forming electrically conductive contact structures through the doped dielectric material and in contact with the second materials.

22. A microelectronic device, comprising:
at least one stair step structure within a stack structure comprising tiers each individually comprising a conductive structure and an insulating structure vertically adjacent the conductive structure, the at least one stair step structure having steps comprising horizontal ends of the tiers;
an undoped dielectric material physically contacting upper surfaces of the conductive structures of the steps of the at least one stair step structure; and
a doped dielectric material comprising silicon dioxide doped with one or more of boron, phosphorus, fluorine, and carbon adjacent to and vertically overlying the undoped dielectric material, at least a portion of the doped dielectric material vertically extending below an uppermost step of the at least one stair step structure, the doped dielectric material physically spaced and electrically isolated from the conductive structures of the steps of the at least one stair step structure by the undoped dielectric material.

23. The microelectronic device of claim 22, wherein the doped dielectric material comprises silicon dioxide formed by plasma enhanced chemical vapor deposition using tetraethyl orthosilicate.

24. The microelectronic device of claim 22, wherein the doped dielectric material is located between the undoped dielectric material and another undoped dielectric material.

25. The microelectronic device of claim 22, wherein the doped dielectric material comprises boron and phosphorus.

26. The microelectronic device of claim 25, wherein the doped dielectric material comprises a greater weight percent of boron than of phosphorus.

27. The microelectronic device of claim 22, wherein the doped dielectric material comprises a gradient of the one or more of boron, phosphorus, fluorine, and carbon.

28. The microelectronic device of claim 22, wherein the doped dielectric material comprises a substantially uniform concentration of the one or more of boron, phosphorus, fluorine, and carbon.

29. An electronic device, comprising:
an input device;
an output device;
a processor device operably coupled to the input device and the output device; and
a memory device operably coupled to the processor device, the memory device comprising:
  a stack structure comprising alternating conductive structures and insulating structures arranged in tiers;
  a stadium structure within the stack structure and comprising opposing stair step structures each individually having steps comprising edges of the tiers; and
  a dielectric material disposed horizontally between the opposing stair step structures of the stadium structure and comprising silicon dioxide, the dielectric material doped with boron and one or more additional dopants selected from phosphorus, carbon, and fluorine, a concentration of boron decreasing with a distance from the edges of the tiers and a distance from an upper portion of the dielectric material and a concentration of the one or more additional dopants increasing with the distance from edges of the tiers and the distance from an upper portion of the dielectric material.

* * * * *

UNITED STATES PATENT AND TRADEMARK OFFICE
CERTIFICATE OF CORRECTION

PATENT NO. : 11,411,013 B2
APPLICATION NO. : 16/737777
DATED : August 9, 2022
INVENTOR(S) : Jivaan Kishore Jhothiraman, Kunal Shrotri and Matthew J. King It is certified that error appears in the above-identified patent and that said Letters Patent is hereby corrected as shown below:

In the Specification

| | | |
|---|---|---|
| Column 22, | Line 64, | change "Sift" to --$SiO_2$-- |
| Column 24, | Line 31, | change "Sift" to --$SiO_2$-- |
| Column 24, | Line 59, | change "Sift" to --$SiO_2$-- |
| Column 25, | Line 64, | change "BPIEOS" to --BPTEOS-- |

Signed and Sealed this
Sixth Day of December, 2022

Katherine Kelly Vidal
*Director of the United States Patent and Trademark Office*